United States Patent
Chiang et al.

(10) Patent No.: US 12,389,694 B2
(45) Date of Patent: Aug. 12, 2025

(54) DATA STORAGE ELEMENT AND MANUFACTURING METHOD THEREOF

(71) Applicant: Taiwan Semiconductor Manufacturing Company, Ltd., Hsin-Chu (TW)

(72) Inventors: Hung-Li Chiang, Taipei (TW); Chao-Ching Cheng, Hsinchu (TW); Jung-Piao Chiu, Kaohsiung (TW); Tzu-Chiang Chen, Hsinchu (TW); Yu-Sheng Chen, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/360,157

(22) Filed: Jul. 27, 2023

(65) Prior Publication Data

US 2023/0378202 A1     Nov. 23, 2023

Related U.S. Application Data

(62) Division of application No. 17/000,582, filed on Aug. 24, 2020, now Pat. No. 11,837,611.

(51) Int. Cl.
*H10N 70/20* (2023.01)
*H10F 39/12* (2025.01)
*H10N 70/00* (2023.01)

(52) U.S. Cl.
CPC .......... *H10F 39/12* (2025.01); *H10N 70/021* (2023.02); *H10N 70/841* (2023.02)

(58) Field of Classification Search
CPC .................... H10N 70/826; H10N 70/8265
See application file for complete search history.

(56) References Cited

U.S. PATENT DOCUMENTS

| | | | |
|---|---|---|---|
| 4,845,533 A | 7/1989 | Pryor et al. | |
| 7,205,562 B2 | 4/2007 | Wicker | |
| (Continued) | | | |

FOREIGN PATENT DOCUMENTS

| | | |
|---|---|---|
| JP | 2008159760 A | 7/2008 |
| JP | 2012244017 A | 12/2012 |

OTHER PUBLICATIONS

Non-Final Office Action dated Sep. 15, 2022 for U.S. Appl. No. 17/000,582.

(Continued)

*Primary Examiner* — Mark V Prenty
(74) *Attorney, Agent, or Firm* — Eschweiler & Potashnik, LLC

(57) ABSTRACT

Disclosed herein, in some embodiments, is a memory device. The memory device includes a bottom electrode disposed over a substrate and a top electrode disposed over the bottom electrode. An upper surface of the bottom electrode faces away from the substrate. A bottom surface of the top electrode faces the substrate. A data storage layer is arranged between the bottom electrode and the top electrode. At least a portion of the bottom surface of the top electrode does not overlap with any portion of the top surface of the bottom electrode along a first direction parallel to the bottom surface of the top electrode. Furthermore, at least a portion of the top surface of the bottom electrode does not overlap with any portion of the bottom surface of the top electrode along the first direction.

20 Claims, 14 Drawing Sheets

(56) References Cited

U.S. PATENT DOCUMENTS

| | | |
|---|---|---|
| 9,627,443 B2 | 4/2017 | Jo et al. |
| 11,522,131 B2 | 12/2022 | Hsieh et al. |
| 11,837,611 B2 * | 12/2023 | Chiang ................ H01L 27/146 |
| 2004/0166604 A1 | 8/2004 | Ha et al. |
| 2008/0186762 A1 | 8/2008 | Chuo et al. |
| 2009/0189136 A1 | 7/2009 | Matsuzaki |
| 2011/0291064 A1 | 12/2011 | Marsh et al. |
| 2015/0137059 A1 | 5/2015 | Chen et al. |
| 2017/0207387 A1 | 7/2017 | Yang et al. |
| 2020/0127189 A1 | 4/2020 | Liao et al. |
| 2021/0050517 A1 | 2/2021 | Banno et al. |

OTHER PUBLICATIONS

Non-Final Office Action dated Feb. 23, 2023 for U.S. Appl. No. 17/000,582.

Notice of Allowance dated Jul. 26, 2023 for U.S. Appl. No. 17/000,582.

* cited by examiner

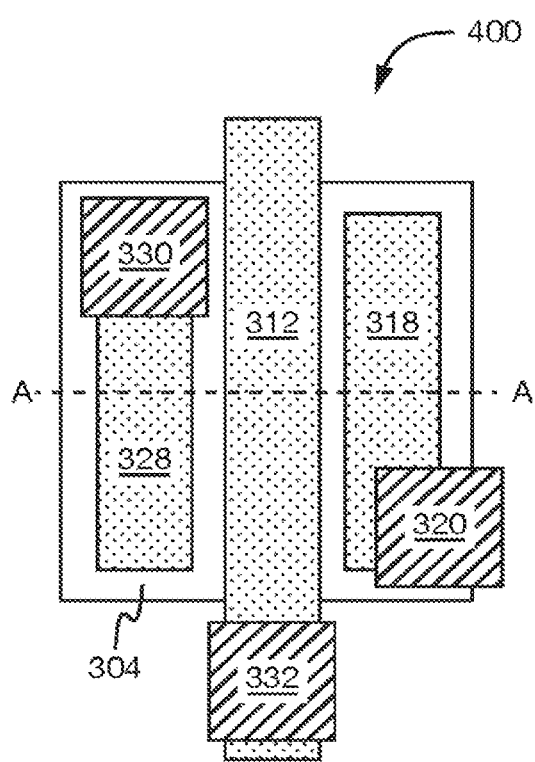
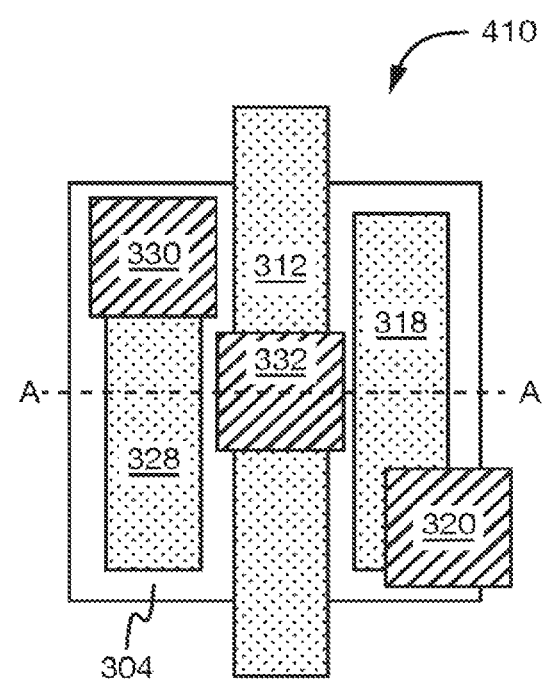
Fig. 4A
Fig. 4B

DATA STORAGE ELEMENT AND MANUFACTURING METHOD THEREOF

REFERENCE TO RELATED APPLICATION

This application is a Divisional of U.S. application Ser. No. 17/000,582, filed on Aug. 24, 2020, the contents of which are hereby incorporated by reference in their entirety.

BACKGROUND

Many modern day electronic devices include non-volatile memory. Non-volatile memory is electronic memory that is able to store data in the absence of power. Some promising candidates for the next generation of non-volatile memory include resistive data storage elements such as resistive random-access memory (RRAM) and phase change memory (PRAM). Resistive data storage elements have a simple structure and are compatible with complementary metal-oxide-semiconductor (CMOS) logic fabrication processes. Compared to current non-volatile memory, such as flash memory, resistive data storage elements may provide faster switching times and/or lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The figures show schematic illustrations of FIG. 1A: a data storage element having a data storage layer according to some examples of the present disclosure in a cross-sectional side view;

FIG. 4A-4B: memory cells with shifted vias according to some examples of the present disclosure in top view;

DETAILED DESCRIPTION

Figure 1A:
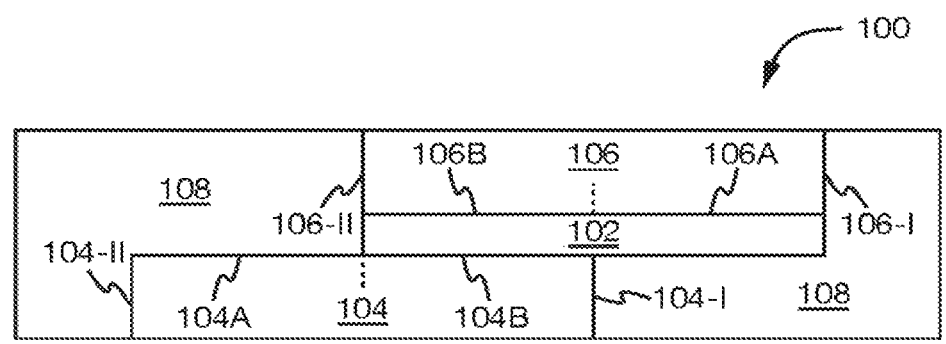
FIG. 1B: the data storage element of FIG. 1a in a low-resistance state in a cross-sectional side view.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various examples and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive data storage element typically comprises a bottom electrode, a top electrode and a resistive memory layer arranged between the bottom electrode and the top electrode. The resistive memory layer has a switchable electrical resistance, e.g. a low-resistance state and a high-resistance state, which may be used to encode one bit of data (i.e. "1" or "0"). An RRAM data storage element comprises a dielectric resistive memory layer, which is insulating in its normal state. In certain dielectric materials, however, defects such as oxygen vacancies may be formed if a sufficiently large initialization voltage is applied. These defects can carry a charge and can move within the dielectric material, giving rise to a non-zero conductivity. After the initial formation of the defects, the memory layer can be switched between a conducting state and a substantially insulating state by application of appropriate voltages across the memory layer.

Yet, the electrical resistance in the low-resistance state may vary from one data storage element to the other. In dielectric resistive memory layers, the defects may form conductive filaments extending through the dielectric material. If the applied electric field during initialization is uniform, no preferred location for the formation of a conductive filament exists and multiple conductive filaments may form at different locations throughout the dielectric material. This may lead to different variations of the electrical resistance in different data storage elements. Furthermore, the switching voltages of RRAM data storage elements may differ as well due to the varying number of conductive filaments.

In view of the foregoing, various examples of the present application are directed at a data storage element with a bottom electrode and a top electrode that are displaced with respect to each other. As a result of the spatial shift between the bottom and top electrodes, the data storage element has an asymmetric structure with respect to an underlying contact. The asymmetric structure may give rise to a non-uniform electric field when applying a voltage between the electrodes. Thereby, the formation of conductive filaments may be facilitated in some regions and hindered in other regions. This may allow for better control of the number of filaments and may thus reduce the variation of performance characteristics between different data storage elements. Other examples of the present application relate to a memory cell and a method of manufacturing a data storage element addressing similar challenges.

FIG. 1a depicts a data storage element 100 in accordance with some examples of the present disclosure in a cross-sectional side view. The data storage element 100 comprises a data storage layer 102 that is configured to store data. The data storage layer 102 may for example comprise a resistive memory layer, in which data is encoded in an electrical resistance of the resistive memory layer. The data storage layer 102 may e.g. comprise a phase change memory layer or a dielectric resistive memory layer as described in more detail below.

The data storage layer 102 is arranged between a bottom electrode 104 and a top electrode 106. An upper surface of the bottom electrode 104 is in contact with a bottom surface of the data storage layer 102. A bottom surface of the top electrode 106 is in contact with an upper surface of the data storage layer 102. The respective elements may for example be in direct physical and/or electrical contact. In other examples, the respective elements may be in operative contact through a thin layer arranged in between, e.g. a thin conductive layer providing electrical contact between the elements.

The bottom electrode 104 and/or the top electrode 106 comprise or consist of a conductive material, for example aluminum, copper, tungsten, tantalum nitride, titanium nitride, platinum, iridium, ruthenium, silver, gold or a combination thereof. The bottom electrode 104 and/or the top electrode 106 may be electrically coupled to other elements such as a transistor, a ground line, a bit-line and/or a word-line, e.g. as described below with reference to FIGS. 3a, 3b. In some examples, the bottom surface of the top electrode 106 and the upper surface of the bottom electrode 104 may be substantially parallel. The bottom surface of the top electrode 106 and/or the upper surface of the bottom electrode 104 may be substantially planar surfaces.

The data storage layer 102, the bottom electrode 104 and/or the top electrode 106 may be surrounded by or embedded in a dielectric layer 108. The dielectric layer 108 may for example comprise or consist of silicon dioxide, silicon nitride, silicon carbide, a low-k dielectric or a combination thereof. As used herein, a low-k dielectric may be, for example, a dielectric with a dielectric constant k less than about 3.9, 3, 2, or 1. In some examples, the dielectric layer 108 may comprise two or more layers, for example a lower layer surrounding the bottom electrode 104 and an upper layer surrounding the top electrode 106 and/or the data storage layer 102, e.g. as described below with reference to FIGS. 3a, 3b. In some examples, the dielectric layer 108 may be a part of an interlayer dielectric (ILD) layer, an intermetal dielectric (IMD) layer and/or an etch stop layer of a semiconductor device.

The bottom surface of the top electrode 106 comprises a portion 106A that does not overlap with any portion of the upper surface of the bottom electrode 104 along a first direction parallel to the bottom surface of the top electrode 106. In some examples, the bottom surface of the top electrode 106 may also comprise a portion 106B that overlaps with a portion 104B along the first direction as in the example of FIG. 1a, i.e. the portion 106B opposes the portion 104B along a direction perpendicular to the bottom surface of the top electrode 106. In other words, the bottom surface of the top electrode 106 may extend along the first direction beyond a first sidewall 104-I of the bottom electrode 104 such that a first sidewall 106-I of the top electrode 106 is shifted with respect to the first sidewall 104-I of the bottom electrode 104. In FIG. 1a, the boundary between the portions 106A and 106B is indicated by a dashed line corresponding to a continuation of the first sidewall 104-I of the bottom electrode 104. In some examples, the portion 106B may comprise no more than 60%, in one example no more than 40% of the surface area of the bottom surface of the top electrode 106. In one particular example, the portion 106B may comprise approximately 50% of the surface area of the bottom surface of the top electrode 106. In some examples, the portion 106B may comprise at least 10%, in one example at least 20% of the surface area of the bottom surface of the top electrode 106. In other examples, the bottom surface of the top electrode 106 may not have any overlap with the upper surface of the bottom electrode 104 along the first direction, e.g. as described below with reference to FIG. 2a.

The upper surface of the bottom electrode 104 comprises a portion 104A that does not overlap with any portion of the bottom surface of the top electrode 106 along the first direction. In other words, the upper surface of the bottom electrode 104 may extend along the first direction beyond a second sidewall 106-II of the top electrode 106 such that a second sidewall 104-II of the bottom electrode 104 is shifted with respect to the second sidewall 106-II of the top electrode 106. In FIG. 1a, the boundary between the portions 104A and 104B is indicated by a dashed line corresponding to a continuation of the second sidewall 106-II of the top electrode 106. In some examples, the portion 104B may comprise no more than 60%, in some examples no more than 40% of the surface area of the upper surface of the bottom electrode 104. In one particular example, the portion 104B may comprise approximately 50% of the surface area of the upper surface of the bottom electrode 104. In some examples, the portion 104B may comprise at least 10%, in one example at least 20% of the surface area of the upper surface of the bottom electrode 104.

The data storage layer 102 may be arranged on the bottom surface of the top electrode 106, e.g. such that the data storage layer 102 covers or overlaps with at least a part of the portion 106A and at least a part of the portion 106B. Accordingly, the data storage layer 102 may also cover at least a part of the portion 104B of the upper surface of the bottom electrode 104. In some examples, the data storage layer 102 may cover or overlap with at least a part of the portion 104A of the upper surface of the bottom electrode 104. In some examples, the data storage layer 102 may cover or overlap with the entire bottom surface of the top electrode 106 and/or the entire upper surface of the bottom electrode 104.

In some examples, the data storage layer 102 may comprise a resistive memory layer. In addition to the resistive memory layer, the data storage layer 102 may comprise other layers, e.g. a top metal layer and/or a bottom metal layer, for example as detailed below with reference to FIG. 2d. The resistive memory layer may comprise or consist of a material with a switchable electrical resistance. The resistive memory layer may e.g. exhibit a high-resistance state and a low-resistance state. Accordingly, the state of the resistive memory may be used to encode one bit of data. In some examples, the resistive memory layer may be a dielectric resistive memory layer. The dielectric resistive memory layer comprises or consists of a dielectric material with a high-resistance state, in which the resistive memory layer is substantially insulating, and a low-resistance state, in which the resistive memory layer is conducting. The dielectric material may for example comprise or consist of an oxide such as a hafnium oxide (e.g. $HfO_2$), a zirconium oxide (e.g. $ZrO_2$), an aluminum oxide (e.g. $Al_2O_3$), a tantalum oxide (e.g. $Ta_2O_5$), a niobium oxide (e.g. $Nb_2O_5$), a vanadium oxide (e.g. $Va_2O_5$), a titanium oxide (e.g. $TiO_2$), a tantalum titanium oxide, a hafnium aluminum oxide, a hafnium tantalum oxide, a tantalum aluminum oxide or a combination thereof. A state change of the dielectric resistive memory layer may for example be induced by a voltage applied across the resistive memory layer, e.g. between the bottom electrode 104 and the top electrode 106.

Figure 1B:
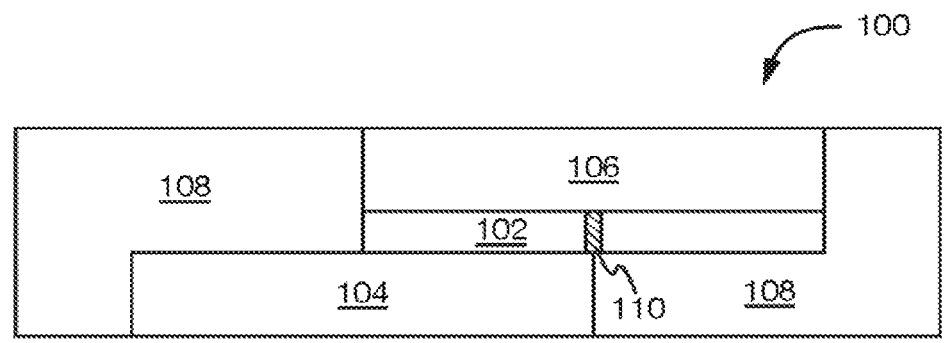

In FIG. 1b, the data storage element 100 is shown with a dielectric resistive memory layer in the low-resistance state. On the other hand, the illustration of FIG. 1a may correspond to the data storage element 100 with the dielectric resistive memory layer in the high-resistance state. In the low-resistance state, defects such as vacancies, e.g. oxygen vacancies in an oxide, may be present in the dielectric resistive memory layer. The defects may for example be located in a filament 110 (e.g., a conductive filament) extending across the thickness of the dielectric resistive memory layer, e.g. from the top electrode 106 to the bottom electrode 104 or from a top metal layer of the data storage layer 102 to a bottom metal layer. The filament 110 may for example be formed initially by applying an initialization voltage across the dielectric resistive memory layer. The initialization voltage may for example be between approximately 1.5 V and approximately 3 V. After the initial formation, the filament 110 may e.g. be broken or reset by a reset voltage and re-formed or set by a set voltage to transfer data to the data storage layer 102. The set voltage may be smaller than the initialization and may e.g. be between approximately 0.5 V and approximately 2 V.

When applying a voltage between the bottom electrode 104 and the top electrode 106, an electric field in the data storage layer 102 may be inhomogeneous due to the partial overlap between the bottom electrode 104 and the top electrode 106. In some examples, the electric field may be stronger in the vicinity of an edge of the bottom electrode 104 connecting the portion 104B to the sidewall 104-I than in other parts of the data storage layer 102 that are farther away from the edge. The asymmetric arrangement of the top and bottom electrodes 104, 106 in the data storage element 100 may thus facilitate the formation of a conducting filament in the vicinity of the edge of the bottom electrode 104 or, more generally speaking, may facilitate controlling the location of a conducting path through the data storage layer 102. In some examples, a single conducting filament may be formed. This may reduce the variation of performance characteristics between different data storage elements. The asymmetric arrangement may e.g. lead to a smaller variation of the electrical resistance in the low-resistance state, the set voltage and/or the reset voltage.

FIGS. 2a-2d show cross-sectional side views of data storage elements 200, 210, 220 and 230, respectively, in accordance with some examples of the present disclosure. The data storage elements 200, 210, 220, 230 are similar to the data storage element 100 of FIGS. 1a, 1b and also comprise a data storage layer 102 arranged between a bottom electrode 104 and a top electrode 106. The data storage layer 102 comprises a dielectric resistive memory layer. In FIGS. 2a-2d, the data storage layer 102 is depicted in a low-resistance state, in which a conducting filament 110 extending through the dielectric resistive memory layer is formed.

Figure 2A:
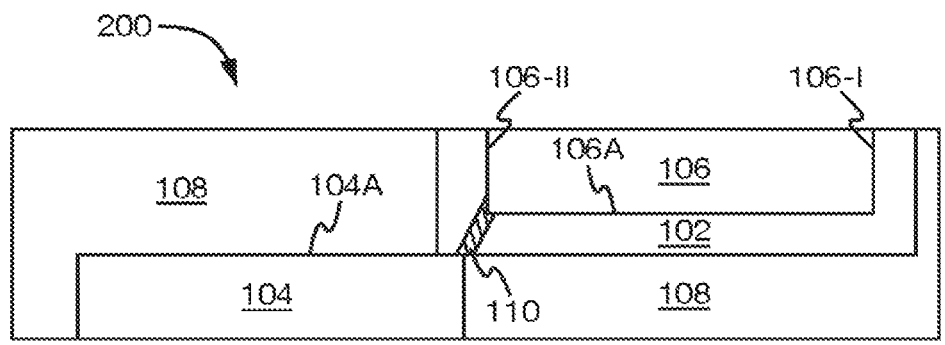
FIG. 2A-2D: data storage elements with a dielectric resistive data storage layer in accordance with some examples of the present disclosure in a cross-sectional side view.

In some examples, as shown in FIG. 2a, the bottom surface of the top electrode 106 does not overlap with the upper surface of the bottom electrode 104 along the first direction parallel to the bottom surface of the top electrode 106. In other words, the portion 106A that does not overlap with any portion of the upper surface of the bottom electrode 104 may cover the entire bottom surface area of the top electrode. The portion 104A that does not overlap with any portion of the bottom surface of the top electrode 106 may cover the entire upper surface area of the bottom electrode 104. The filament 110 may extend between opposing edges of the bottom electrode 104 and top electrode 106, respectively, as illustrated in FIG. 2a.

In some examples, as shown in FIGS. 2a-2d, the data storage layer 102 may surround the bottom surface of the top electrode 106 and at least a part of a sidewall of the top electrode 106. The data storage layer 102 may for example surround the bottom surface and at least a part of the sidewalls 106-I, 106-II, i.e. the data storage layer 102 may cover the entire bottom surface and may extend along all or part of the sidewalls 106-I, 106-II. The data storage layer 102 may also surround at least a part of sidewalls of the top electrode 106 connecting the sidewalls 106-I and 106-II, e.g. sidewalls parallel the drawing plane of FIGS. 2a-2d, thus surrounding the top electrode along all of its sidewalls. In some examples, the data storage layer 102 may have a substantially uniform thickness. The data storage layer 102 may for example surround the top electrode 106 conformally.

Figure 2B:
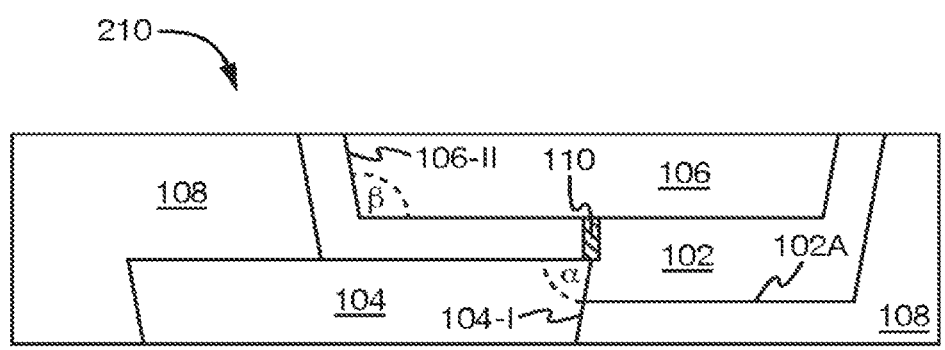

Referring to the data storage element 210 of FIG. 2b, the bottom surface of the data storage layer 102 may comprise a protrusion 102A extending along at least part of a sidewall of the bottom electrode 104, e.g. the sidewall 104-I. Accordingly, a portion of the data storage layer 102 may extend into the dielectric layer 108 or a sublayer thereof below the upper surface of the bottom electrode 104. The edge of the bottom electrode 104 between the sidewall 104-I and the upper surface may thus be surrounded by the data storage layer 102. In some examples, the protrusion 102A may be in direct contact with the sidewall 104-I.

In some examples, at least one sidewall of the bottom electrode 104 is tapered, e.g. the sidewall 104-I. The tapered sidewall 104-I may form an acute angle α with the upper surface of the bottom electrode 104 at an edge of the bottom electrode 104 facing the bottom surface of the top electrode 106. The angle α may for example be between approximately 70° and approximately 85°. In some examples, without being bound by any theory, the acute angle α may result in a stronger electric field in the vicinity of the edge of the bottom electrode 104 and may thus facilitate formation of the filament 110 between the edge of the bottom electrode and the bottom surface of the top electrode 106.

In some examples, at least one sidewall of the top electrode 106 is tapered, e.g. the sidewall 106-II. The tapered sidewall 106-II may form an obtuse angle α with the bottom surface of the top electrode 106 at an edge of the top electrode 106 facing the upper surface of the bottom electrode 104. The angle α may for example be between approximately 95° and approximately 110°. In some examples, without being bound by any theory, the obtuse angle α may result in a weaker electric field in the vicinity of the edge of the top electrode 106 and may thus hinder formation of a conducting filament between the edge of the top electrode 106 and the upper surface of the bottom electrode 104. In some such examples, an absolute value of a slope of the tapered sidewall 106-II is less than an absolute value of a scope of sidewall 104-I.

In further examples, at least one sidewall of the bottom electrode 104 is tapered, e.g. the sidewall 104-I, and at least one sidewall of the top electrode 106 is tapered, e.g. the sidewall 106-II, as shown in FIG. 2b. Moreover, in one example, all sidewalls of the bottom electrode and of the top electrode may be tapered. Additionally or alternatively, one or more edges of the top electrode 106 and/or of the data storage layer 102, in particular the edge of the top electrode 106 facing the upper surface of the bottom electrode 104 may be rounded, e.g. as described below with reference to FIG. 10.

Figure 2C:
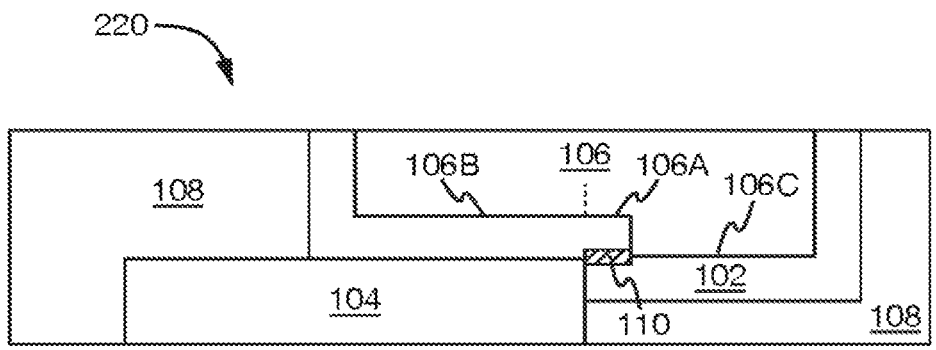

In some examples, the bottom surface of the top electrode 106 may not be a planar surface. The bottom surface of the top electrode 106 may for example comprise a protrusion 106C extending towards the bottom electrode 104 such as for the data storage element 220 of FIG. 2c. The protrusion 106C may for example be aligned with or part of the portion 106A, i.e. may not overlap with any portion of the upper surface of the bottom electrode 104. The filament 110 may for example be formed between an edge of the protrusion 106C and an opposing edge of the bottom electrode 104, e.g. as illustrated in FIG. 2c. In some examples, the protrusion 106C may extend to a depth that is substantially aligned with the upper surface of the bottom electrode 104 as in the example of FIG. 2c. In other examples, a center of the protrusion 106C may be substantially aligned with an edge of the bottom electrode 104 in the first direction. A distance between the upper surface of bottom electrode 104 and the protrusion 106C may be smaller than a distance between the upper surface of the bottom electrode 104 and any other portion of the bottom surface of the top electrode 106.

Additionally or alternatively, the bottom surface of the top electrode 106 may comprise a recess, e.g. in the portion 106B. In some examples, an edge of the top electrode 106 facing the bottom electrode 104 may be recessed relative to a portion of the bottom surface of the top electrode 106 facing an edge of the bottom electrode 104. A distance between the bottom electrode 104 and the edge of the top electrode 106 facing the bottom electrode 104 may be smaller than a distance between the top electrode 106 and an edge of the bottom electrode 104 facing the top electrode 106.

Figure 2D:
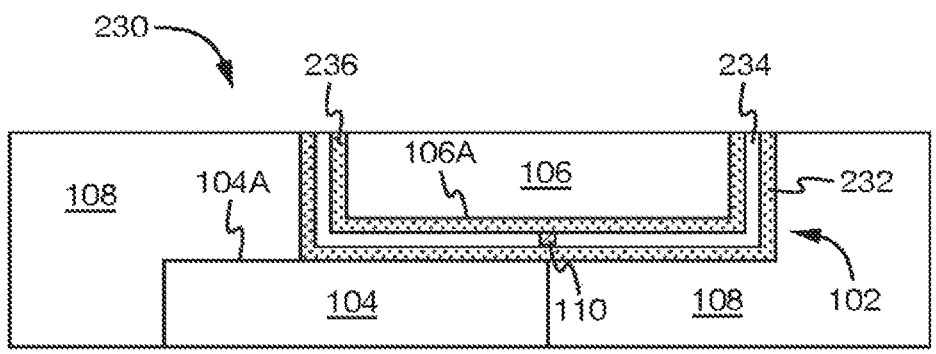

In some examples, the data storage layer 102 may comprise other layers in addition to the resistive memory layer, e.g. as in the data storage element 230 illustrated in FIG. 2d. In the example of FIG. 2d, the data storage layer 102 comprises a bottom metal layer 232, a resistive memory layer 234 and a top metal layer 236. The resistive memory layer 234 may for example be arranged between the top metal layer 236 and the bottom metal layer 232. The top metal layer 236 may e.g. be in direct or operative contact with the bottom surface of the top electrode 106 and the bottom metal layer 232 may e.g. be in direct or operative contact with the upper surface of the bottom electrode 104. Each of the top and bottom metal layers 232, 236 may for example comprise or consist of platinum, ruthenium, tantalum nitride, titanium nitride, iridium, tungsten, aluminum, copper, silver, gold or a combination thereof. In some examples, the data storage layer 102 may comprise a barrier layer (not shown), e.g. between the resistive memory layer 234 and one of the top and bottom metal layers 232, 236. The barrier layer may for example comprise or consist of aluminum (e.g. $Al_2O_3$), hafnium (e.g. $HfO_2$), zirconium (e.g. $ZrO_2$), lanthanum, tantalum, titanium or a combination thereof. The barrier layer may have a lower concentration of oxygen than the resistive memory layer 234 and may have a higher reactivity with oxygen than the top and/or bottom metal layer 232, 236.

While the data storage layer of FIG. 2d is illustrated as having other layers in addition to the resistive memory layer, it will be appreciated that in some embodiments the data storage layer of FIGS. 1a-1b and FIGS. 2a-2c may also have other layers in addition to the resistive memory layer (e.g., a resistive memory layer disposed between a bottom metal layer and a top metal layer). In some such embodiments (e.g., corresponding to that data storage layers of FIGS. 1a-1b) the bottom metal layer, the resistive memory layer, and the top metal layer may comprise substantially planar layers, so that a bottom of the resistive memory layer is over a top of the bottom metal layer and a bottom of the top metal layer is over a top of the resistive memory layer. In other such embodiments (e.g., corresponding to that data storage layers of FIGS. 2a-2c), the bottom metal layer and the top metal layer may be arranged along both vertically and horizontally extending surfaces of the resistive memory layer. In yet other such embodiments (e.g., corresponding to that data storage layers of FIGS. 2b-2c), the bottom metal layer, the resistive memory layer, and the top metal layer may respectively have a protrusion that extends outward from a lower surface, so that one or more of the bottom metal layer, the resistive memory layer, and the top metal layer extend below a top of the bottom electrode 104 to along a sidewall of the bottom electrode 104.

Figure 3A:
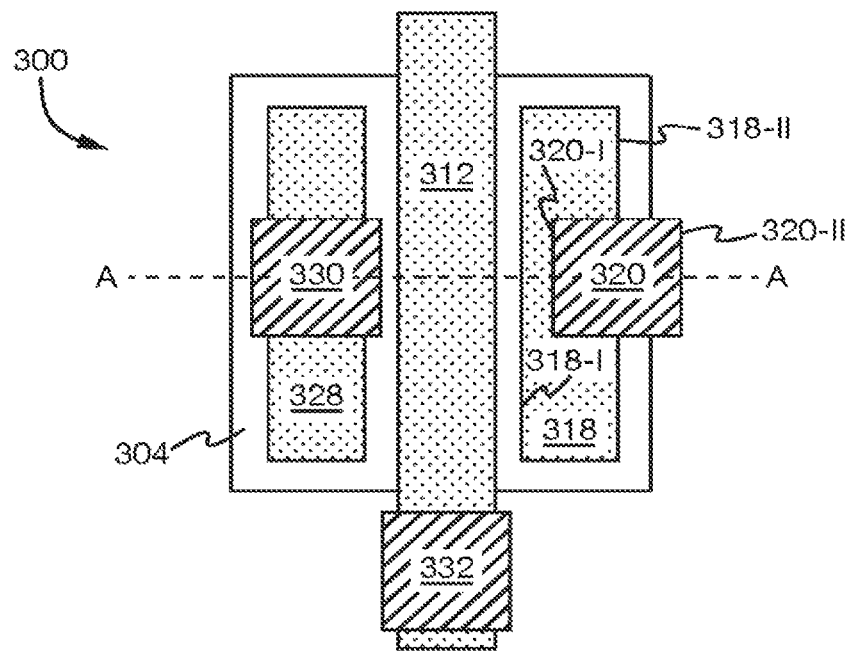
FIG. 3A: a memory cell according to some examples of the present disclosure in top view.
Figure 3B:
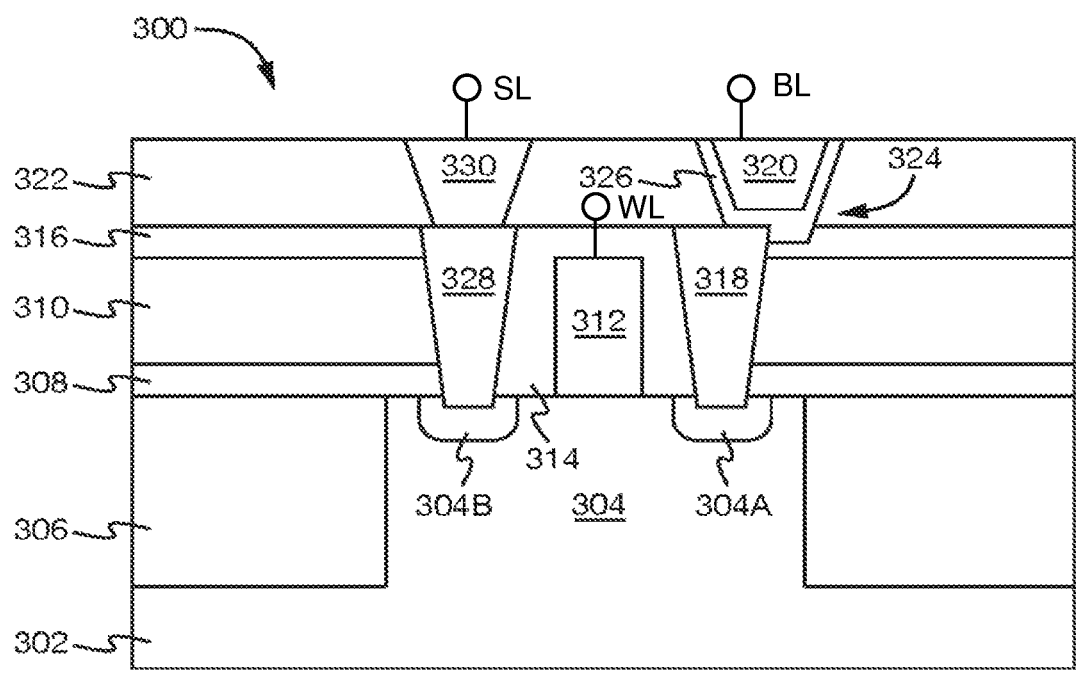
FIG. 3B: the memory cell of FIG. 3a in a cross-sectional side view.

FIGS. 3a and 3b show schematic illustrations of a memory cell 300 according to some examples of the present disclosure. FIG. 3a depicts the memory cell 300 in top view and FIG. 3b depicts a cross-sectional side view of the memory cell along the line A-A in FIG. 3a.

The memory cell 300 may comprise a substrate 302, which may for example be a bulk substrate, e.g. a bulk silicon substrate, or a silicon-on-insulator substrate. The substrate 302 may comprise an active region 304, in which a transistor comprising a first source/drain (S/D) region 304A and a second S/D region 304B is arranged. The active region 304 and/or the substrate 302 may be doped to have a first conductivity type and the first and second S/D regions 304A, 304B may be doped to have a second conductivity type opposite to the first conductivity type. In some examples, the active region 304 may be a planar structure for a planar field-effect transistor, e.g. as illustrated in FIG. 3a. In other embodiments (not shown), the active region 304 may comprise a fin structure for a field effect transistor (FinFET). The active region 304 may be surrounded by a shallow trench insulation (STI) region 306, which may e.g. comprise or consist of a dielectric material arranged in a trench in the substrate 302. The dielectric material may e.g. comprise or consist of silicon dioxide, silicon nitride, a low-k dielectric or a combination thereof. Above the active region 304, one or more layers may be disposed, for example a lower etch stop layer or contact etch stop layer (CESL) 308 and a first dielectric layer 310. The lower etch stop layer 308 may for example comprise or consist of silicon carbide, silicon nitride, silicon carbon nitride, silicon carbon oxide, silicon oxynitride, silicon dioxide, a low-k dielectric or a combination thereof. The dielectric layer 310 may for example comprise or consist of silicon dioxide, silicon nitride, a low-k dielectric or a combination thereof.

A gate structure 312 is arranged on top of a channel region of the transistor in the active region 304 between the first and second S/D regions 304A, 304B. The gate structure 312 may for example be a gate stack comprising a gate dielectric and a gate electrode. The gate dielectric may for example comprise or consist of silicon dioxide, a high-k dielectric material, e.g. hafnium oxide, zirconium oxide, lanthanum oxide, titanium oxide, yttrium oxide or strontium titanate, aluminum oxide (e.g. $Al_2O_3$) or a combination thereof. The gate electrode may for example comprise or consist of doped polysilicon or a metal such as aluminum, copper, tungsten or a combination thereof. The gate structure 312 may be surrounded by a dielectric spacer 314, which may for example comprise or consist of silicon oxide, silicon nitride, silicon carbide or a combination thereof. An intermediate etch stop layer (MESL) 316 may be disposed above the gate structure 312, where the intermediate etch stop layer 316 may comprise or consist of silicon carbide, silicon nitride, silicon carbon nitride, silicon carbon oxide, silicon oxynitride, silicon oxide, a low-k dielectric or a combination thereof.

The memory cell 300 further comprises a first middle-end-of-the-line (MEOL) structure 318 in the first dielectric layer 310. The first MEOL structure 318 may for example comprise or consist of aluminum, copper, tungsten, tantalum nitride, titanium nitride, platinum, iridium, ruthenium or a combination thereof. The first MEOL structure 318 is electrically coupled to the first S/D region 304A of the transistor. The first MEOL structure 318 may for example extend through the CESL 308, the first dielectric layer 310 and the MESL 316. The memory cell 300 also comprises a first via 320 in a second dielectric layer 322 above the first dielectric layer 310. The first via 320 may for example comprise or consist of aluminum, copper, tungsten, tantalum nitride, titanium nitride, platinum, iridium, ruthenium or a combination thereof. The second dielectric layer 322 may for example be disposed on top of the MESL 316. The second dielectric layer 322 may e.g. comprise or consist of silicon dioxide, silicon nitride, a low-k dielectric or a combination thereof.

The first MEOL structure 318 and the first via 320 form the bottom and top electrode, respectively, of a data storage element 324 comprising a data storage layer 326, which is disposed between a top surface of the first MEOL structure 318 and a bottom surface of the first via 320. By using the first MEOL structure as a bottom electrode, adjacent memory devices can be formed at a relatively small pitch and a high density array can be achieved. In some examples, the data storage element 324 may be similar to one or more of the data storage elements 100, 200, 210, 220 and 230 described above. Accordingly, the data storage layer 326 may be similar to the data storage layer 102 and may for example comprise a resistive memory layer, e.g. a dielectric resistive memory layer, as described above. In some examples, the data storage layer 102 may extend into the MESL 316, e.g. similar to the data storage elements 210 and 220. In some examples, the bottom surface of the first via 320 may comprise a protrusion (not shown) extending towards the top surface of the first MEOL structure 318, e.g. similar to the data storage element 220. Additionally or alternatively, at least one sidewall of the first MEOL structure 318 and/or at least one sidewall of the first via 320 may be tapered, e.g. as described above with reference to FIG. 2b.

The top surface of the first MEOL structure 318 extends along a first direction from a first edge 318-I to a second edge 318-II. In some examples, the first direction may be parallel to a channel of the transistor extending from the second S/D region 304B to the first S/D region 304A, which may e.g. be aligned with the line A-A in the example of FIG. 3a. In other examples, the first direction may for example be perpendicular to the channel of the transistor. The bottom surface of the first via 320 extends along the first direction from a third edge 320-I to a fourth edge 320-II. The fourth edge 320-II is shifted with respect to the second edge 318-II in the first direction. The data storage element 324 may thus be asymmetric with respect to a plane perpendicular to the first direction. In some examples, at least a portion of the bottom surface of the first via 320 may extend beyond the second edge 318-II in the first direction as in the example of FIG. 3a. In some examples, the fourth edge 320-II may be shifted with respect to the second edge 318-II in the first direction so that the bottom surface of the first via 320 straddles the first edge 318-I or the second edge 318-II.

In some examples, the third edge 320-I may be shifted with respect to the first edge 318-I in the first direction. At least a portion of the top surface of the first MEOL structure 318 may thus extend beyond the third edge 320-I in a direction opposite to the first direction as in the example of FIG. 3a. In some examples, the third edge 320-I may be shifted beyond the second edge 318-II, i.e. the bottom surface of the first via 320 may not have any overlap with the top surface of the first MEOL structure 318 similar to the data storage element 200.

In some embodiments, a source-line SL comprising a first interconnect wire is coupled to the second S/D region 304B, a word-line WL comprising a second interconnect wire is coupled to the gate structure 312, and a bit-line BL comprising a third interconnect wire is coupled to the first via 320. Data may be read out from the data storage layer 326 and/or written to the data storage layer 326 by selectively applying bias voltages to the bit-line BL, the source-line SL, and/or the word-line WL. For example, a bias voltage may be applied to the word-line WL to form a conductive channel below the gate structure 312 and thereby allow voltages applied by the source-line SL and the bit-line BL to form a potential difference across the data storage layer 326.

In some embodiments, to read data from the data storage layer 326 the source-line SL and the bit-line BL may apply a first set of bias conditions to the first MEOL structure 318 (e.g., the lower electrode) and the first via 320 (e.g., the upper electrode). The first set of bias conditions result in a current passing through the data storage layer 326, which is indicative of a data state stored by the data storage layer 326. To write a low resistive state within the data storage layer 326, the source-line SL and the bit-line BL may apply a second set of bias conditions to the first MEOL structure 318 (e.g., the lower electrode) and the first via 320 (e.g., the upper electrode). The second set of bias conditions may form an electric field that drives oxygen from the data storage layer 326 to the first via 320 (e.g., the upper electrode), thereby forming a conductive filament of oxygen vacancies across the data storage layer 326. Alternatively, to write a high resistive state within the data storage layer 326, the source-line SL and the bit-line BL may apply a third set of bias conditions to the first MEOL structure 318 (e.g., the lower electrode) and the first via 320 (e.g., the upper electrode). The third set of bias conditions may form an electric field that breaks the conductive filament by driving oxygen from the first via 320 (e.g., the upper electrode) to the data storage layer 326.

When applying a voltage between the first MEOL structure 318 and the first via 320, an electric field in the data storage layer 326 may be inhomogeneous due to the spatial offset between the second and fourth edges 318-II, 320-II. In some examples, the electric field may be stronger in the vicinity of the second edge 318-II of the first MEOL structure 318 than in other parts of the data storage layer 326 that are farther away from the edge 318-II. The asymmetric arrangement of the first MEOL structure 318 and the first via 320 in the data storage element 324 may thus facilitate the formation and spatial control of a conducting filament in the vicinity of the second edge 318-II. In some examples, a single conducting filament may be formed. This may reduce the variation of performance characteristics between different memory cells. The asymmetric arrangement may e.g. lead to a smaller variation of the electrical resistance in the low-resistance state, the set voltage and/or the reset voltage.

In some examples, the memory cell 300 may further comprise a second MEOL structure 328 in the first dielectric layer 310. The second MEOL structure 328 may for example comprise or consist of aluminum, copper, tungsten, tantalum nitride, titanium nitride, platinum, iridium, ruthenium or a combination thereof. The second MEOL structure 328 is electrically coupled to the second S/D region 304B. The second MEOL structure 328 may for example extend through the CESL 308, the first dielectric layer 310 and the MESL 316 similar to the first MEOL structure 318.

In some examples, the memory cell 300 may also comprise a second via 330 in the second dielectric layer 322, wherein the second via 330 is electrically coupled to the second MEOL structure 328. The second via 330 may e.g. provide an electrical connection between the second S/D region 304B and the bit-line BL for reading-out data from the memory cell 300 and/or writing data to the memory cell 300. A center of a bottom surface of the second via 330 may be aligned with a center of a top surface of the second MEOL structure 328 along at least the first direction, i.e. the second MEOL structure 328 and the second via 330 may form a symmetric structure with respect to a plane perpendicular to the first direction as in the example of FIGS. 3a and 3b.

In some examples, the memory cell 300 may further comprise a third via or gate via 332 that is electrically coupled to the gate structure 312. The gate via 332 may for example extend through the dielectric spacer 314 and/or the second dielectric layer 322. The gate via 332 may e.g. provide an electrical connection between the gate structure 312 and the word-line WL for addressing the memory cell 300. The gate via 332 may e.g. be arranged such that the gate via 332 does not have any overlap with the active region 304, i.e. is located outside of the active region 304 in top view as in FIG. 3a. In some embodiments, the gate via 332 may have a top surface that is substantially aligned with a top surface of the first MEOL structure 318 and the second MEOL structure 328.

In some examples, the second via 330 may be shifted with respect to the first via 320 in a second direction perpendicular to the first direction. Examples for this are depicted in FIGS. 4a and 4b, which show a memory cell 400 and 410, respectively, in top view. The memory cells 400, 410 may be similar to the memory cell 300 described above. In some examples, the first direction may be parallel to the channel of the transistor, which may e.g. be aligned with the line A-A in FIGS. 4a, 4b. In some examples, the second via 330 may be shifted such that the second via 330 does not have any overlap with the first via 320 along the second direction as in the examples of FIGS. 4a and 4b. This may create space for an overlay window between the first and second vias 320, 330 as in the memory cell 400. In other examples, the gate via 332 may be arranged between the first via 320 and the second via 330 as shown in FIG. 4b.

Figure 5:
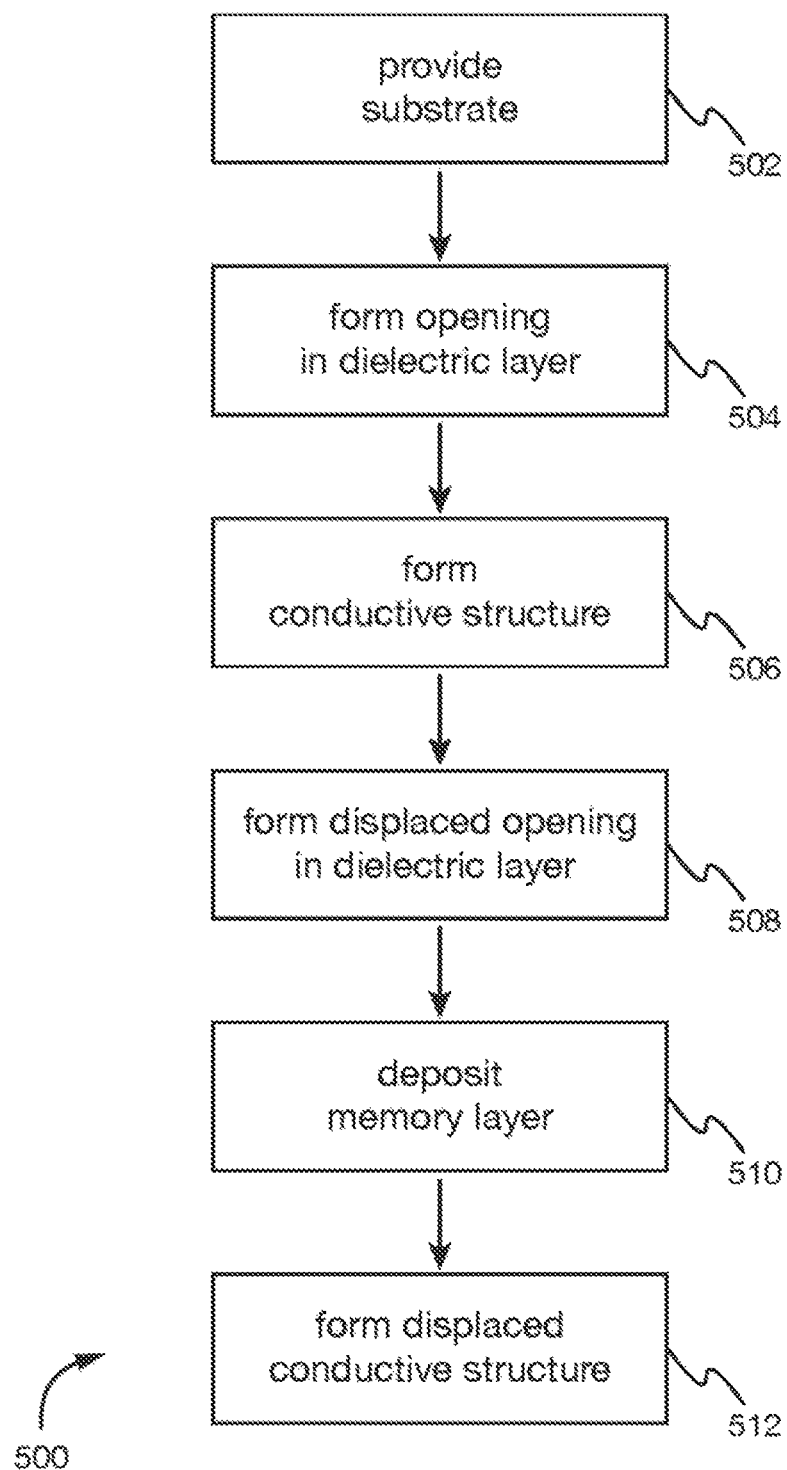
FIG. 5: a flow chart of a method of manufacturing a data storage element in accordance with some examples of the present disclosure.

FIG. 5 shows a flow chart of a method 500 of manufacturing a data storage element in accordance with some examples of the present disclosure. Although this method and other methods illustrated and/or described herein are illustrated as a series of steps or events, it will be appreciated that the present disclosure is not limited to the illustrated ordering or steps. Thus, in some examples, the steps may be carried out in different orders than illustrated, and/or may be carried out concurrently. Further, in some examples, the illustrated steps or events may be subdivided into multiple steps or events, which may be carried out at separate times or concurrently with other steps or sub-steps. In some examples, some illustrated steps or events may be omitted, and other un-illustrated steps or events may be included.

In the following, the method 500 is described using the memory cell 300 with the data storage element 324 as an example. Cross-sectional side views of a workpiece 300A at various stages of manufacture are shown in FIGS. 6a-6f. The method 500, however, is not limited to this example and it will be appreciated that the method 500 may also be used to manufacture other data storage elements and/or memory cells comprising a data storage element, e.g. the data storage elements 100, 200, 210, 220 and 230 and/or the memory cells 400, 410, 900 and 1000 described herein.

The method 500 comprises, in step 502, providing a substrate with a dielectric layer above a first conductive structure. In this example, the first conductive structure may correspond to the first MEOL structure 318, which is thus also referred to as the first conductive structure 318 in the following. The dielectric layer above the first conductive structure 318 may correspond to the second dielectric layer 322 in this example, which is thus also referred to as the dielectric layer 322 in the following. In other examples, the first conductive structure and the dielectric layer may correspond to the bottom electrode 104 and the dielectric layer 108, respectively, of one of the data storage elements 100, 200, 210, 220 and 230. The first conductive structure 318 may for example consist of or comprise aluminum, copper, tungsten, tantalum nitride, titanium nitride, platinum, iridium, ruthenium or a combination thereof. The second dielectric layer 322 may for example comprise or consist of silicon dioxide, silicon nitride, a low-dielectric or a combination thereof.

Figure 6A:
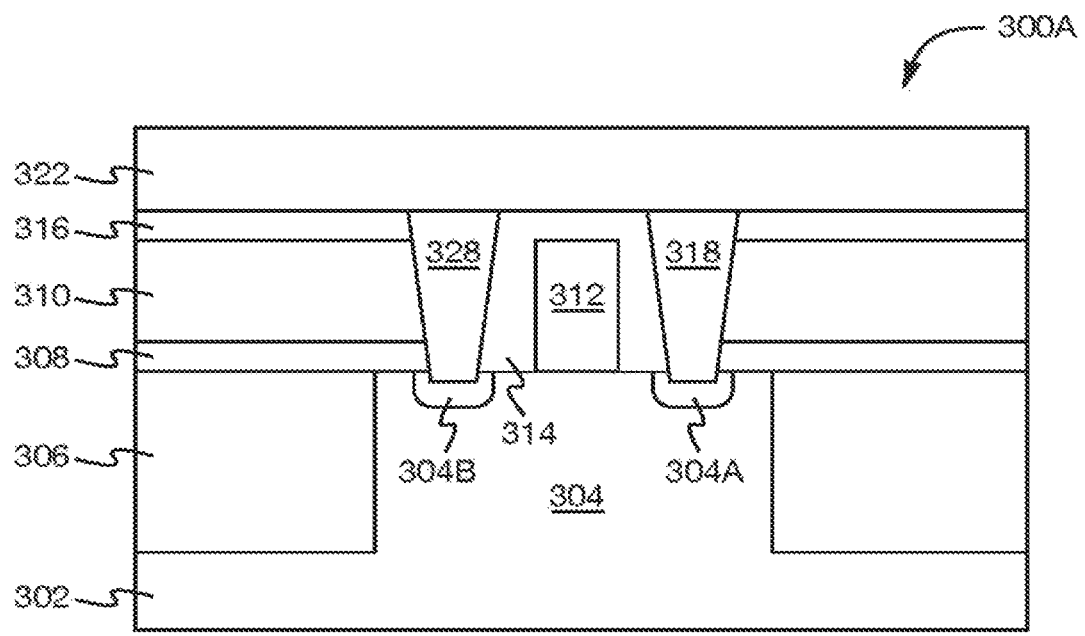
FIG. 6A-6F: a sequence of exemplary manufacturing steps of the method of FIG. 5 in a cross-sectional side view.

The dielectric layer 322 covers the first conductive structure 318, as shown in FIG. 6a. The dielectric layer 322 may e.g. serve as a passivation layer protecting the first conductive structure 318. In addition, the workpiece 300A may comprise further elements as illustrated in FIG. 6a, for example an active region 304 with first and second S/D regions 304A, 304B, a STI region 306, one or more of the layers 308, 310, 316, a gate structure 312, a dielectric spacer 314 and/or a third conductive structure 328 that may correspond to a second MEOL structure 328. In some examples, elements in FIGS. 6a-6f labelled with the same reference signs as in FIG. 3b may correspond to the respective elements of the memory cell 300. In this regard, reference is made to the description above.

Figure 6B:
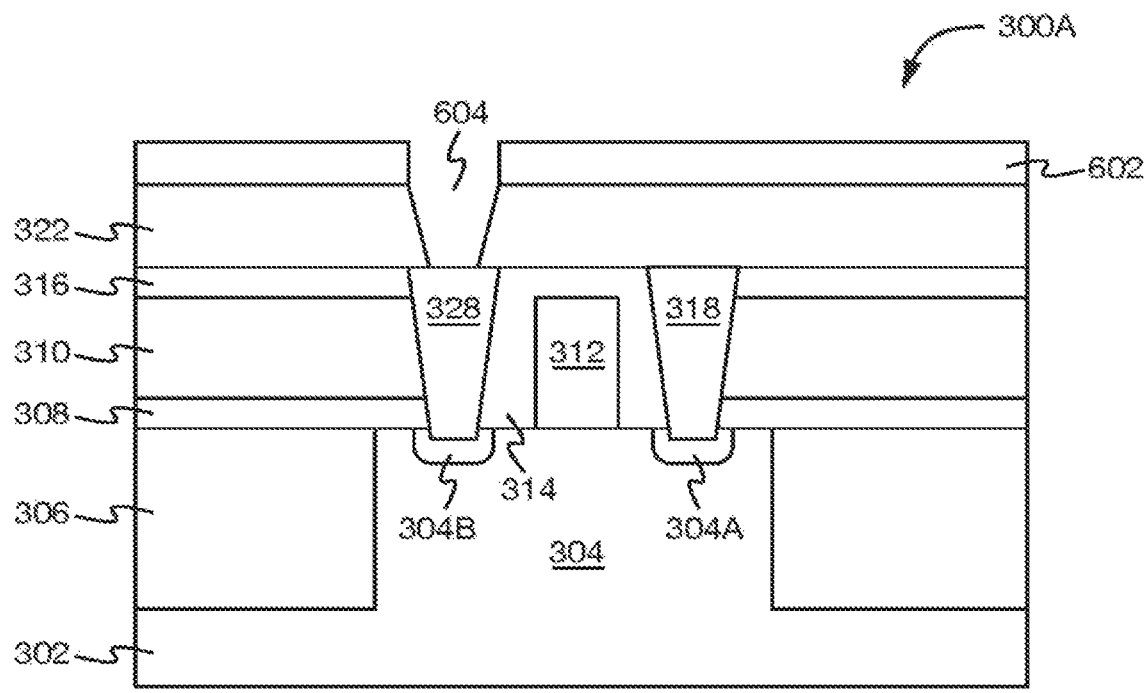

In some examples, the method 500 may comprise, in step 504, forming an opening 604 in the dielectric layer 322 that exposes at least a portion of an upper or top surface of the third conductive structure 328. This may for example comprise depositing and patterning a first mask layer 602 on the dielectric layer 322 and performing a first etch using the first mask layer 602 as a mask as illustrated in FIG. 6b. The first mask layer 602 may for example comprise or consist of a photoresist and/or a hardmask material, e.g. silicon oxynitride, silicon nitride or silicon dioxide. The first etch may e.g. be a unidirectional or vertical etch. The first etch may remove exposed portions of the dielectric layer 322. In some examples, the first etch may stop at the upper surface of the third conductive structure 328 and/or the intermediate etch stop layer 316. A center of the opening 604 may be aligned with a center of the upper surface of the third conductive structure 328 as shown in FIG. 6b.

Figure 6C:
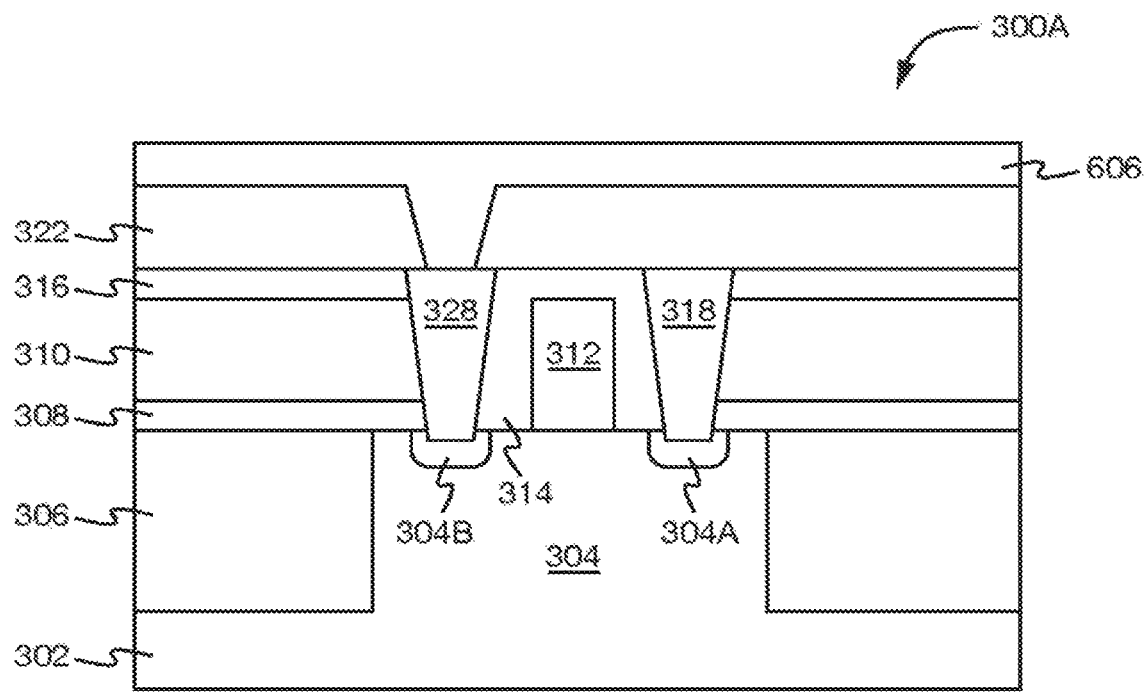
Figure 6D:
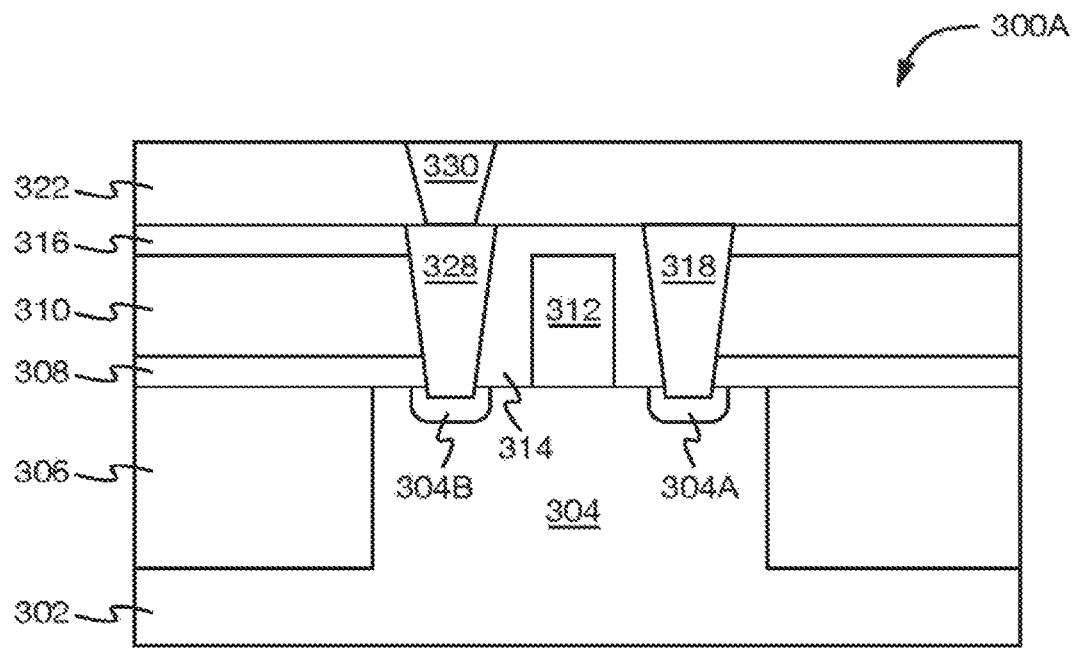

In some examples, the method 500 may comprise, in step 506, forming a conductive structure in the opening 604, e.g. the second via 330. As illustrated in FIG. 6c, this may comprise depositing a conductive layer 606 within the opening 604 and on the dielectric layer 322, e.g. by atomic layer deposition, chemical vapor deposition, plasma vapor deposition, spin coating or a combination thereof. The conductive layer 606 may e.g. comprise or consist of aluminum, copper, tungsten, tantalum nitride, titanium nitride, platinum, iridium, ruthenium or a combination thereof. In some examples, this may also comprise removing parts of the conductive layers 606 outside of the opening 604 as shown in FIG. 6d. The parts of the conductive layers 606 outside of the opening 604 may for example be removed by planarization, which may e.g. comprise chemical-mechanical polishing.

Figure 6E:
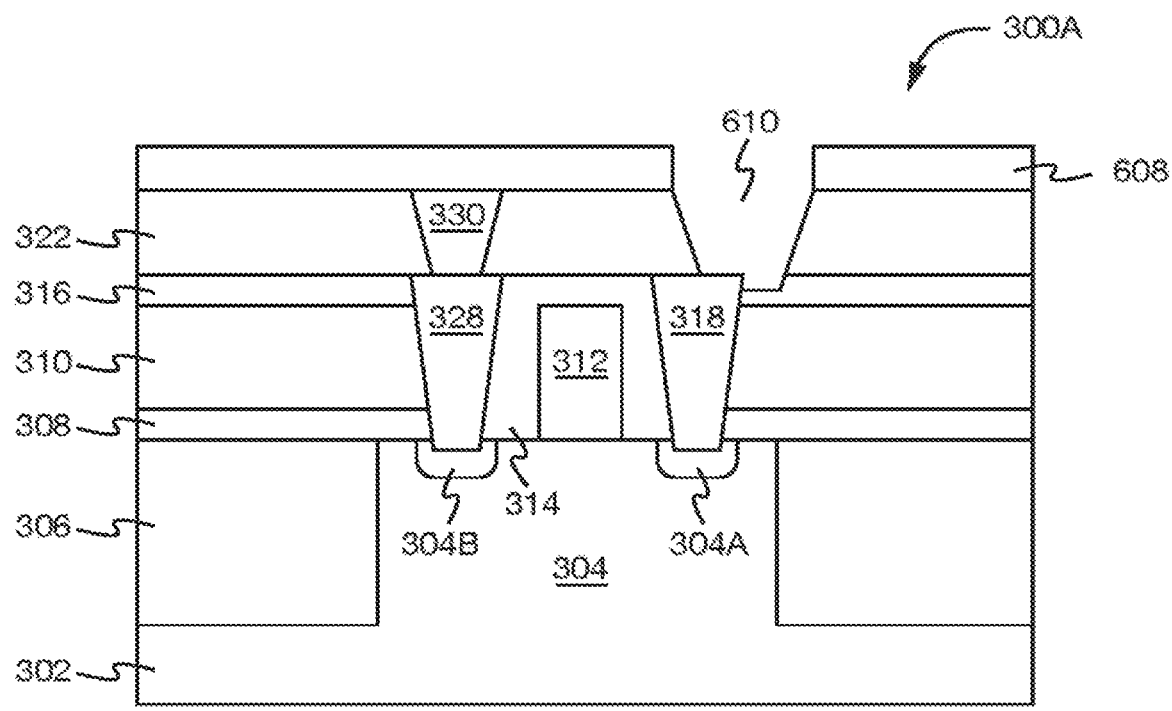

The method 500 further comprises, in step 508, forming a displaced opening 610 in the dielectric layer 322 that exposes a portion of an upper or top surface of the first conductive structure 318 in this example. A center of the displaced opening 610 is displaced from a center of the upper surface of the first conductive structure 318 in a first direction parallel to the upper surface of the first conductive structure 318. In some examples, the exposed portion may comprise no more than 65%, in one example no more than 45% of the surface area of the upper surface of the first conductive structure 318. In some examples, the exposed portion may comprise at least 5%, in one example at least 15% of the surface area of the upper surface of the first conductive structure 318. Forming the displaced opening 610 may for example comprise depositing and patterning a second mask layer 608 on the dielectric layer 322 and performing a second etch using the second mask layer 608 as a mask as illustrated in FIG. 6e. The second mask layer may for example comprise or consist of a photoresist and/or a hardmask material, e.g. silicon oxynitride, silicon nitride or silicon dioxide. The second etch may e.g. be a unidirectional or vertical etch. The second etch may remove exposed portions of the dielectric layer 322.

In some examples, the second etch may stop at the upper surface of the first conductive structure 318. In other embodiments, the second etch may extend to below an upper surface of the conductive structure 318. In some embodiments, the second etch may etch the second conductive structure 318 that is not covered by dielectric layer 322, so as to reduce a height of a part of the second conductive structure 318 that defines the displaced opening 610. In such embodiments, the second etch causes the conductive structure 318 to have a stepped structure comprising an upper surface that defines the displaced opening 610 and that is recessed below a top surface of the conductive structure 318 (which is covered by dielectric layer 322). In some examples, sidewalls of the displaced opening 610 may be tapered. The tapered sidewalls may form an obtuse angle with a bottom wall of the displaced opening 610, e.g. an angle between approximately 95° and approximately 110°, e.g. to form a data storage element similar to the data storage element 210 of FIG. 2b. In some examples, bottom edges of the displaced opening 610 may be rounded, for example as described below with reference to FIG. 10, e.g. by choosing an appropriate etch chemistry and/or width of the displaced opening 610.

In some examples, the first conductive structure 318 may be arranged in a dielectric layer or etch stop layer 316. Accordingly, the displaced opening 610 may expose a part of the upper surface of the etch stop layer 316 adjacent to the first conductive structure 318. In some examples, the second etch may stop at the upper surface of the etch stop layer 316. In other examples, the second etch may comprise an over etch removing exposed portions of the intermediate etch stop layer 316 at least in part. Accordingly, the displaced opening 610 may extend below the upper surface of the first conductive structure 318 into the etch stop layer 316 as illustrated in FIG. 6e, e.g. to form a data storage element similar to the data storage elements 210, 210 described above.

Figure 6F:
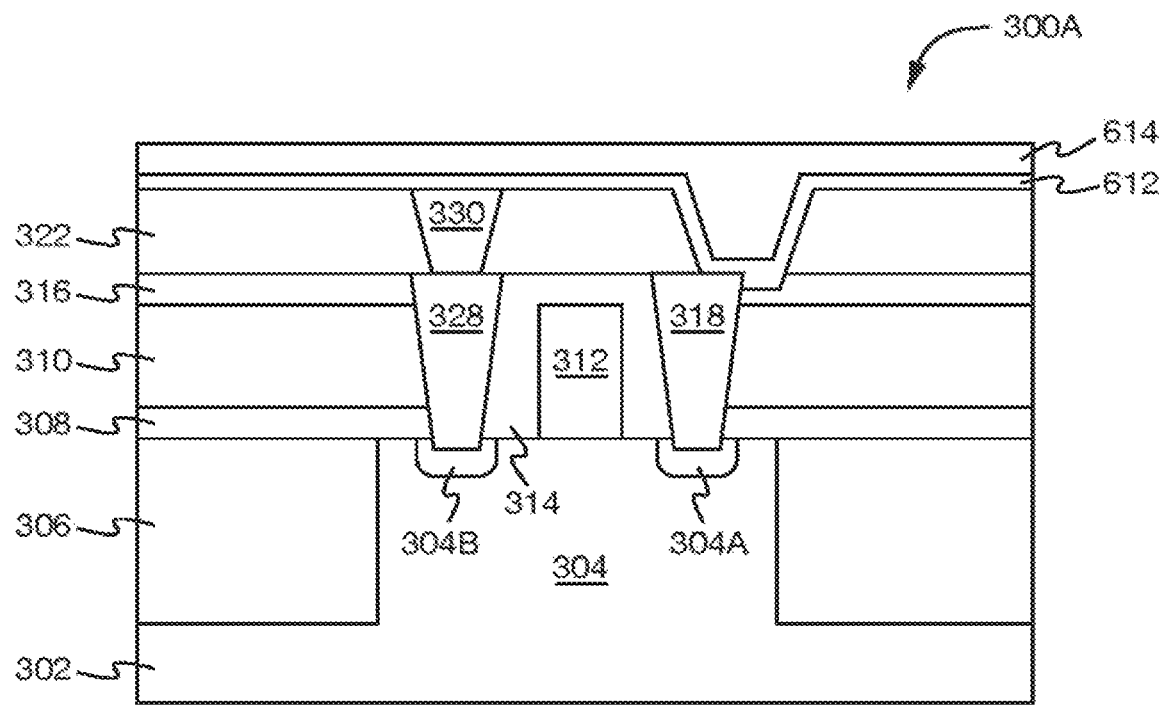

In step 510, a data storage layer 612 is formed in the displaced opening 610. The data storage layer 612 may for example comprises a resistive memory layer such as a dielectric resistive memory layer as described above with reference to FIGS. 1a, 1b. The resistive memory layer may for example comprise or consist of an oxide such as a hafnium oxide (e.g. $HfO_2$), a zirconium oxide (e.g. $ZrO_2$), an aluminum oxide (e.g. $Al_2O_3$), a tantalum oxide (e.g. $Ta_2O_5$), a niobium oxide (e.g. $Nb_2O_5$), a vanadium oxide (e.g. $Va_2O_5$), a titanium oxide (e.g. $TiO_2$), a tantalum titanium oxide, a hafnium aluminum oxide, a hafnium tantalum oxide, a tantalum aluminum oxide or a combination thereof. The data storage layer 612 may also comprise additional layers, e.g. a bottom metal layer, a top metal layer and/or a barrier layer as detailed above with reference to FIG. 2d. The data storage layer 612 may for example be formed by atomic layer deposition, chemical vapor deposition, plasma vapor deposition, spin coating or a combination thereof. The data storage layer 612 may be deposited conformally on a bottom wall and sidewalls of the opening, i.e. such that the data storage layer 612 has a substantially uniform thickness. In some examples, the data storage layer 612 may also be deposited over a top surface of the dielectric layer 322, as illustrated in FIG. 6f.

The method 500 also comprises, in step 512, forming a second conductive structure in the displaced opening 610 above the data storage layer 612. The second conductive structure may for example be the first via 320 of the memory cell 300, which is thus also referred to as the second conductive structure 320 in the following. The second conductive structure 320 may for example be formed by depositing a conductive layer 614 on the data storage layer 612, e.g. by atomic layer deposition, chemical vapor deposition, plasma vapor deposition, spin coating or a combination thereof. The conductive layer 614 may e.g. comprise or consist of aluminum, copper, tungsten, tantalum nitride, titanium nitride, platinum, iridium, ruthenium or a combination thereof. In some examples, the method 500 may also comprise removing parts of the data storage layer 612 and/or the conductive layer 614 outside of the displaced opening 610, e.g. by planarization, resulting in the memory cell 300 shown in FIGS. 3a, 3b.

In some examples, the second conductive structure 320 may be formed such that a sidewall of the second conductive structure 320 is displaced from a sidewall of the first conductive structure 318 in the first direction. For this, a displacement of the center of the displaced opening 610 with respect to the center of the upper surface of the first conductive structure 318 and/or a thickness of the data storage layer 612 may be adjusted accordingly. Respective edges of the first and second conductive structures 318, 320 may thus be displaced with respect to each other, e.g. as shown in FIGS. 3a, 3b. At least a portion of a bottom surface of the second conductive structure 320 may not overlap with any portion of the upper surface of the first conductive structure 318 along the first direction, e.g. similar to the data storage element 100 described above.

The thickness of the data storage layer 612 may be adjusted based on a desired structure of the data storage element to be formed, e.g. by adjusting a deposition or growth time accordingly. In some examples, the thickness of the data storage layer 612 may be chosen such that the bottom surface of the second conductive structure 320 has no overlap with the upper surface of the first conductive structure 318 similar to the data storage element 200 of FIG. 2a. In some examples, the displaced opening 610 may extend into the etch stop layer 316 and the thickness of the data storage layer 612 may be chosen to be sufficiently large such that the data storage layer 612 on a bottom wall and sidewalls of the portion of the displaced opening 610 in the etch stop layer 316 merges into a continuous protrusion similar to the data storage element 210 of FIG. 2b. An upper or top surface of the data storage layer 612 in the displaced opening 610 may thus be substantially flat and the second conductive structure 320 may subsequently be formed thereon. In other examples, the thickness of the data storage layer 612 may be chosen to be sufficiently small such that the top surface of the data storage layer 612 comprises a recess for forming a protrusion of the second conductive structure 320 extending towards the first conductive structure 318 similar to the data storage element 220 of FIG. 2c.

Figure 7:
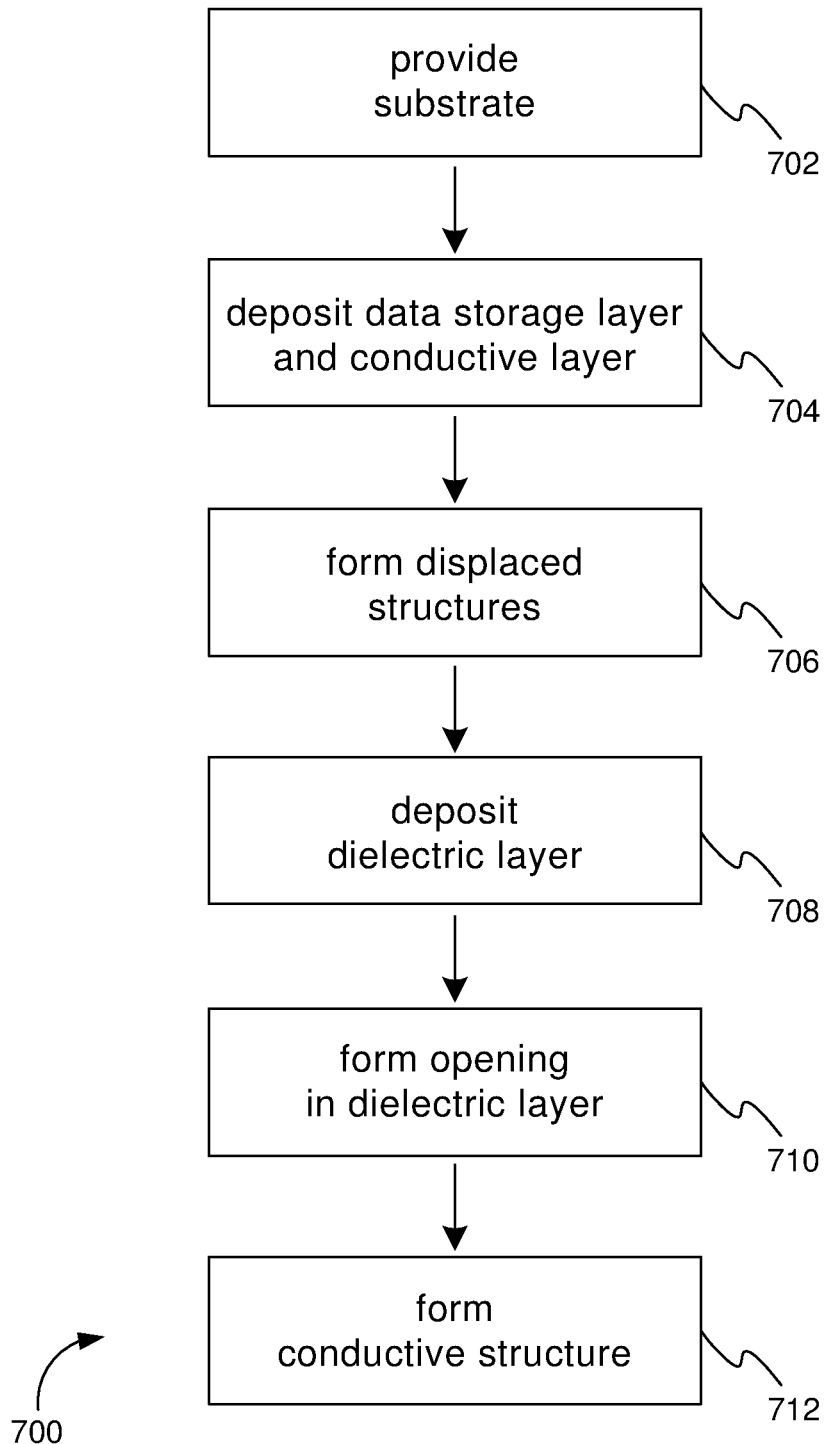
FIG. 7: a flow chart of a method of manufacturing a data storage element in accordance with some examples of the present disclosure.

FIG. 7 shows a flow chart of a method 700 of manufacturing a data storage element in accordance with some examples of the present disclosure. In the following, the method 700 is described using the memory cell 900 of FIG. 9 (see below) as an example. Cross-sectional side views of a workpiece 900A at various stages of manufacture are shown in FIGS. 8a-8f. The method 700, however, is not limited to this example and it will be appreciated that the method 700 may also be used to manufacture other data storage elements and/or memory cells comprising a data storage element, e.g. the data storage elements 100, 200, 210, 220 and 230 and/or the memory cells 300, 400, 410 and 1000 described herein.

The method 700 comprises, in step 702, providing a substrate with a first conductive structure. In this example, the first conductive structure may correspond to a first MEOL structure 318, which is thus also referred to as the first conductive structure 318 in the following. In other examples, the first conductive structure may correspond to the bottom electrode 104 of one of the data storage elements 100, 200, 210, 220 and 230. The first conductive structure 318 may for example consist of or comprise aluminum, copper, tungsten, tantalum nitride, titanium nitride, platinum, iridium, ruthenium or a combination thereof.

Figure 8A:
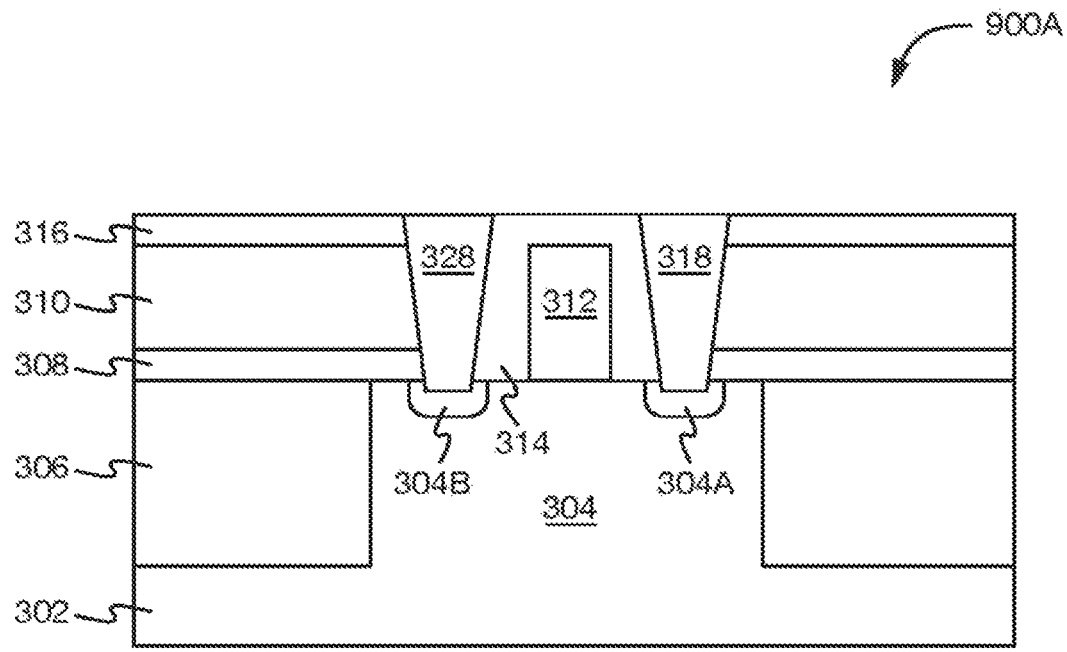
FIG. 8A-8F: a sequence of exemplary manufacturing steps of the method of FIG. 7 in a cross-sectional side view.

In some examples, the workpiece 900A may comprise further elements as illustrated in FIG. 8a, for example an active region 304 with first and second S/D regions 304A, 304B, a STI region 306, one or more of the layers 308, 310, 316, a gate structure 312, a dielectric spacer 314 and/or a third conductive structure 328 that may correspond to a second MEOL structure 328. In some examples, elements in FIGS. 8a-8f labelled with the same reference signs as in FIG. 3b may correspond to the respective elements of the memory cell 300. In this regard, reference is made to the description above.

Figure 8B:
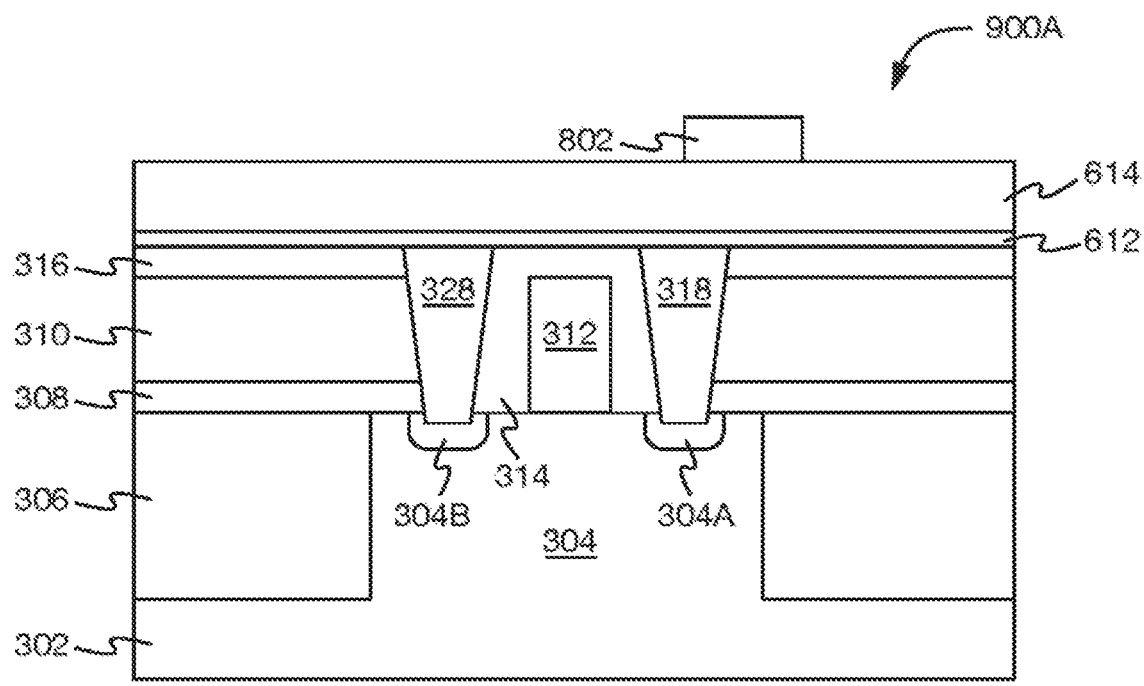

In step 704, a data storage layer 612 and a conductive layer 614 are deposited above the substrate. The data storage layer 612 may be formed above an upper surface of the first conductive structure, e.g. similar as described above for step 510 of method 500. The data storage layer 612 may be deposited with a substantially uniform thickness. In some examples, the data storage layer 612 may be deposited over the intermediate etch stop layer 316, e.g. as shown in FIG. 8b. In some examples, the first conductive structure 318 provided in step 702 may be covered by a protective layer, e.g. a passivation layer. Step 704 may comprise removing the protective layer at least in part to expose a portion of the upper surface of the first conductive structure 318 before forming the data storage layer 612. After forming the data storage layer 612, a conductive layer 614 is formed above the data storage layer 612, e.g. similar as described above for step 512 of method 500. The data storage layer 612 may be deposited with a substantially uniform thickness. The thickness of the conductive layer 614 may be larger than the thickness of the data storage layer 612, e.g. between two times and ten times as thick as the data storage layer 612. In some examples, the conductive layer 614 may be deposited over the entire upper surface of the data storage layer 612, e.g. as shown in FIG. 8b.

Figure 8C:
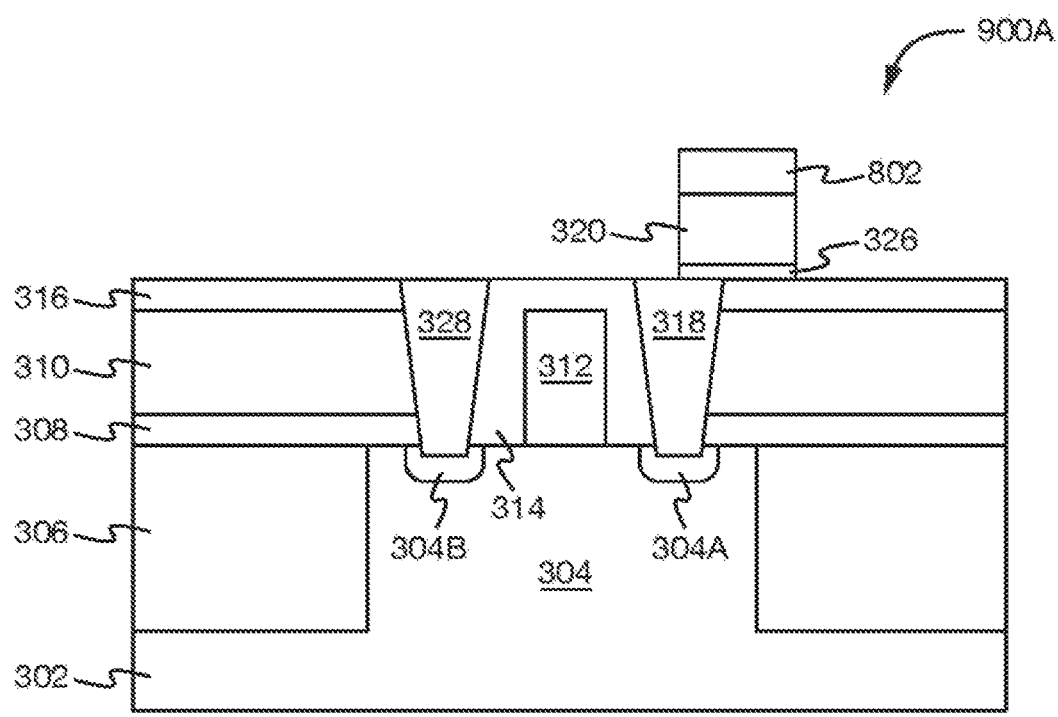

Subsequently, in step 706, the data storage layer 612 and the conductive layer 614 are patterned to form a displaced structure comprising a patterned data storage layer 326 and a second conductive structure. The second conductive structure may e.g. be the first via 320 of the memory cell 900 which is thus also referred to as the second conductive structure 320 in the following. Step 706 may for example comprise depositing and patterning a mask layer 802 on the conductive layer 614 and performing a first etch using the mask layer 802 as a mask as illustrated in FIGS. 8b and 8c. The mask layer 802 may for example comprise or consist of a photoresist and/or a hardmask material, e.g. silicon oxynitride, silicon nitride or silicon dioxide. The first etch may e.g. be a unidirectional or vertical etch. The first etch may remove exposed portions of the layers 612, 614. In some examples, the first etch may stop at the upper surface of the first conductive structure 318 and/or the intermediate etch stop layer 316. The center of the data storage layer 326 and the center of the second conductive structure 320 are displaced from a center of the upper surface of the first conductive structure 318 in a first direction parallel to the upper surface of the first conductive structure 318 as shown in FIG. 8c. In some embodiments, the first etch may give the patterned data storage layer 326 and the first via 320 angled sidewalls, which cause the patterned data storage layer 326 and the first via 320 to get narrower as a distance from the substrate 302 increases.

In some examples, performing the first etch may comprise performing a lateral overetch on sidewalls of the second conductive structure 320 and/or of the data storage layer 326, e.g. to form tapered sidewalls as in the example of FIG. 2b. In some examples, separate etch processes and/or mask layers may be used for patterning the data storage layer 612 and the conductive layer 614, respectively. In one example, an additional etch process is performed after depositing the data storage layer 612 and prior to depositing the conductive layer 614 to form a recess (not shown) in the data storage layer 612. Subsequently, the conductive layer 614 is deposited above the data storage layer 612 before performing the first etch as described above, e.g. such that the data storage layer 326 surrounds the bottom surface and sidewalls of the second conductive structure 320 as in the example of FIG. 3b.

Figure 8D:
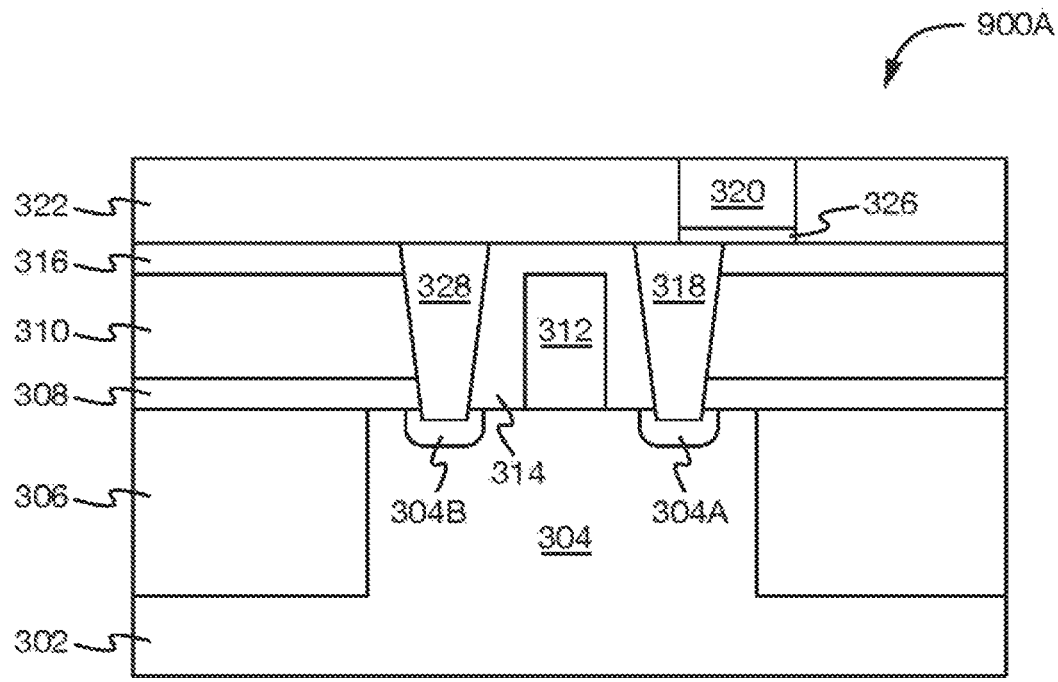

The method 700 may further comprise, in step 708, forming a dielectric layer above the first conductive structure 318 and/or above the intermediate etch stop layer 316 as illustrated in FIG. 8d. The dielectric layer above the first conductive structure 318 may correspond to the second dielectric layer 322 of the memory cell 900 and is thus also referred to as the dielectric layer 322 in the following. The second dielectric layer 322 may for example comprise or consist of silicon dioxide, silicon nitride, a low-k dielectric or a combination thereof. The dielectric layer 322 may for example be formed by atomic layer deposition, chemical vapor deposition, plasma vapor deposition, spin coating or a combination thereof. Step 708 may further comprise planarizing the dielectric layer 322, for example by chemical-mechanical polishing, e.g. to remove parts of the dielectric layer 322 above the second conductive structure 320 such than an upper surface of the dielectric layer 322 is substantially flush with an upper surface of the second conductive structure 320 as shown in FIG. 8d.

Figure 8E:
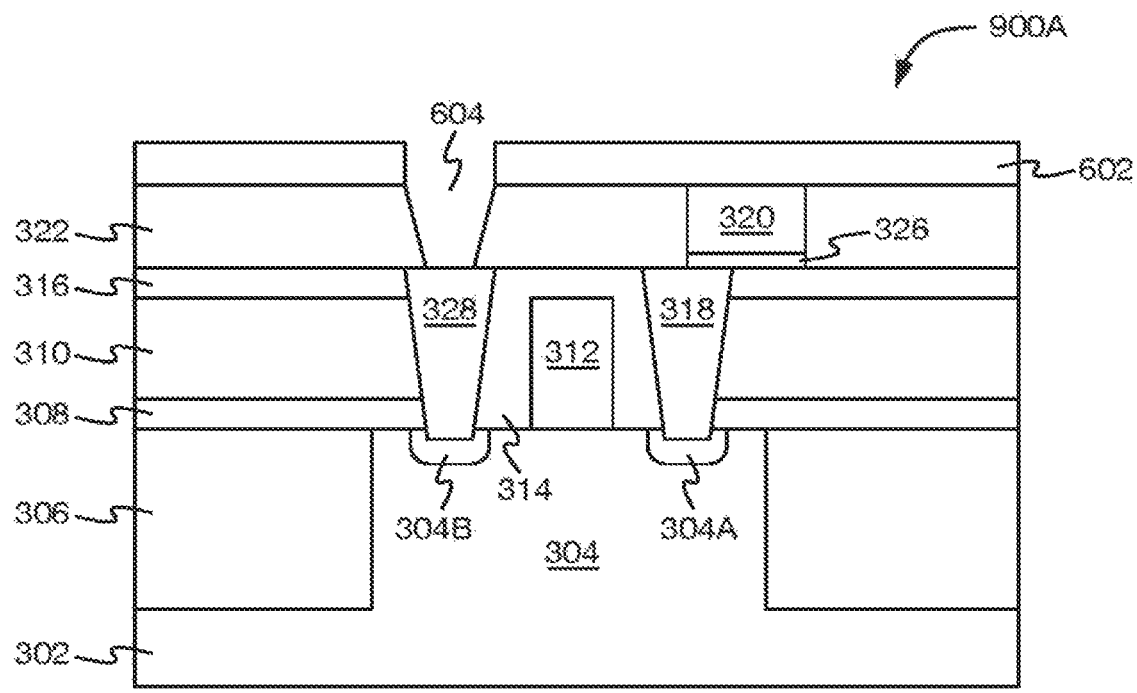

Subsequently, in step 710, an opening 604 may formed in the dielectric layer 322 in some examples, e.g. as described above for step 504 of method 500. This may in particular comprise depositing and patterning a first mask layer 602 on the dielectric layer 322 and performing a second etch using the first mask layer 602 as a mask as illustrated in FIG. 8e.

Figure 8F:
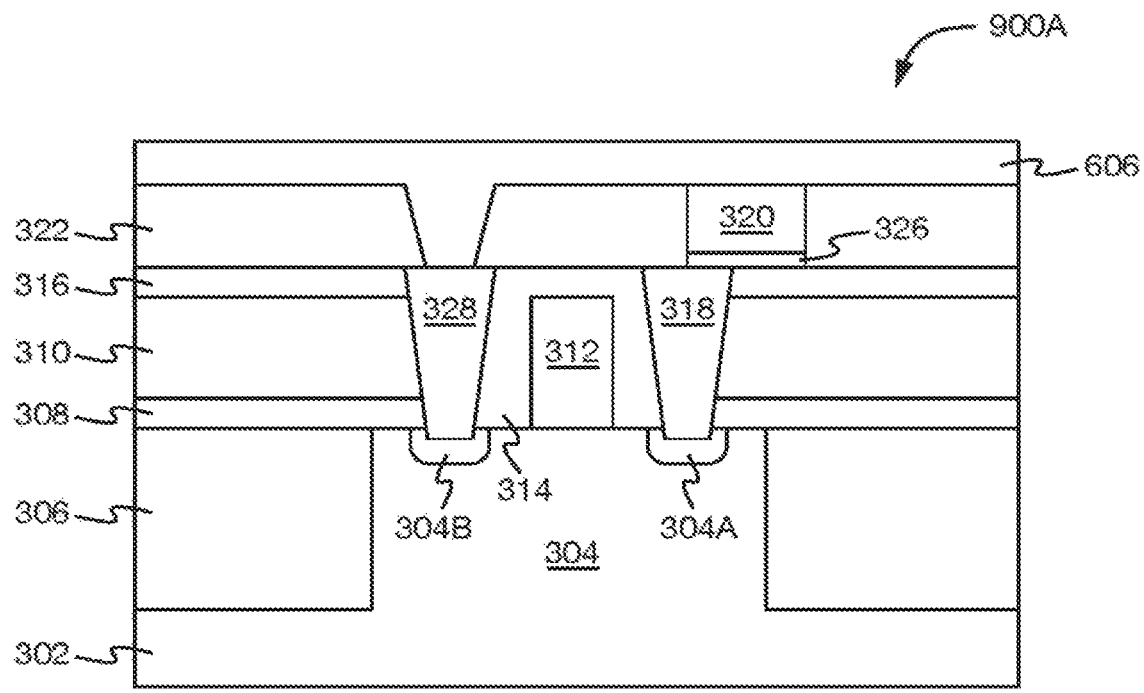

In some examples, the method 700 may also comprise, in step 712, forming a conductive structure in the opening 604, e.g. the second via 330. As illustrated in FIG. 8f, this may comprise depositing a conductive layer 606 on the dielectric layer 322, e.g. similar to step 506 of method 500. In some examples, this may also comprise removing parts of the conductive layers 606 outside of the opening 604, e.g. by chemical-mechanical polishing, resulting in the memory cell 900 shown in FIG. 9.

Figure 9:
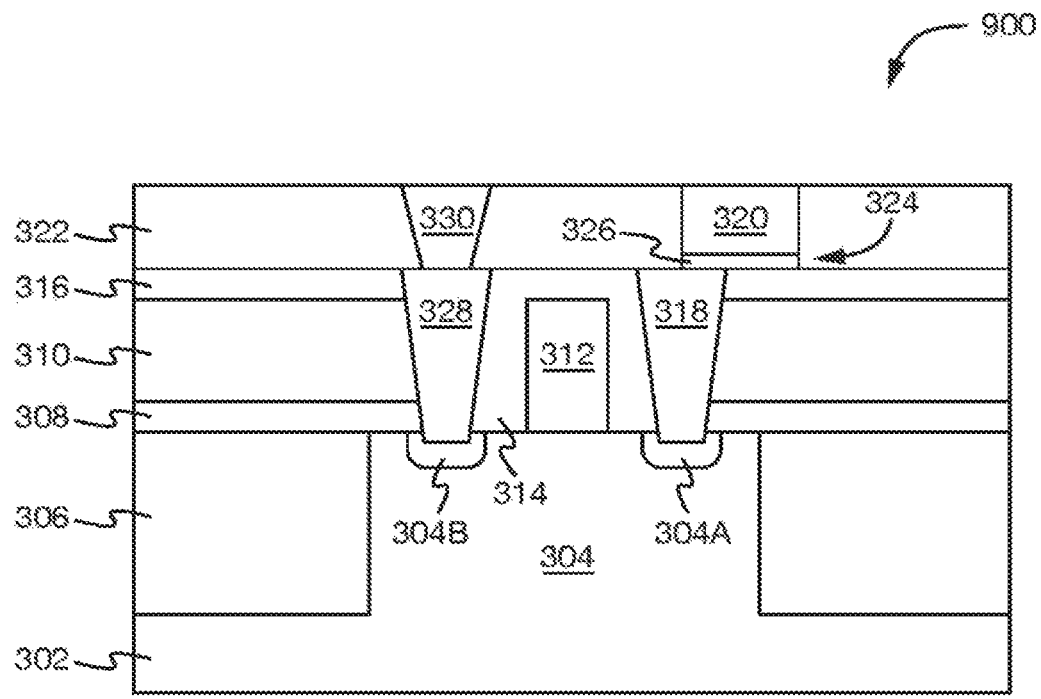
FIG. 9: a memory cell according to some examples of the present disclosure in a cross-sectional side view.

FIG. 9 shows a schematic illustration of a memory cell 900 according to some examples of the present disclosure in a cross-sectional side view. The memory cell 900 is similar to the memory cell 300 of FIGS. 3a, 3b. Accordingly, elements in FIG. 9 labelled with the same reference signs as in FIG. 3b may be similar to or may correspond to the respective elements of the memory cell 300. In this regard, reference is made to the description above. In top view, the memory cell 900 may also be similar to the memory cell 300, i.e. FIG. 9 may correspond to a cross-sectional side view of the memory cell 900 along the line A-A in FIG. 3a.

The memory cell 900 differs from the memory cell 300 in the design of the data storage element 324. In the example of FIG. 9, the data storage element 324 of the memory cell 900 is similar to the data storage element 100 of FIG. 1. The data storage layer 326 is completely covered by the first via 320. In some embodiments, the data storage layer 326 may be a substantially planar structure disposed between a top surface of the first conductive structure or first MEOL structure 318 and a bottom surface of the second conductive structure or first via 320. Sidewalls of the first via 320 and of the data storage layer 326 are surrounded by the second dielectric layer 322, e.g. such that the sidewalls are in direct contact with the second dielectric layer 322. In other embodiments (not shown), the data storage layer 326 may comprise a stepped structure that extends along a sidewall and a top surface of the first MEOL structure 318. In such embodiments, the data storage layer 326 may have a first upper surface directly over MESL 316 and a second upper surface directly over the first MEOL structure 318.

Figure 10:
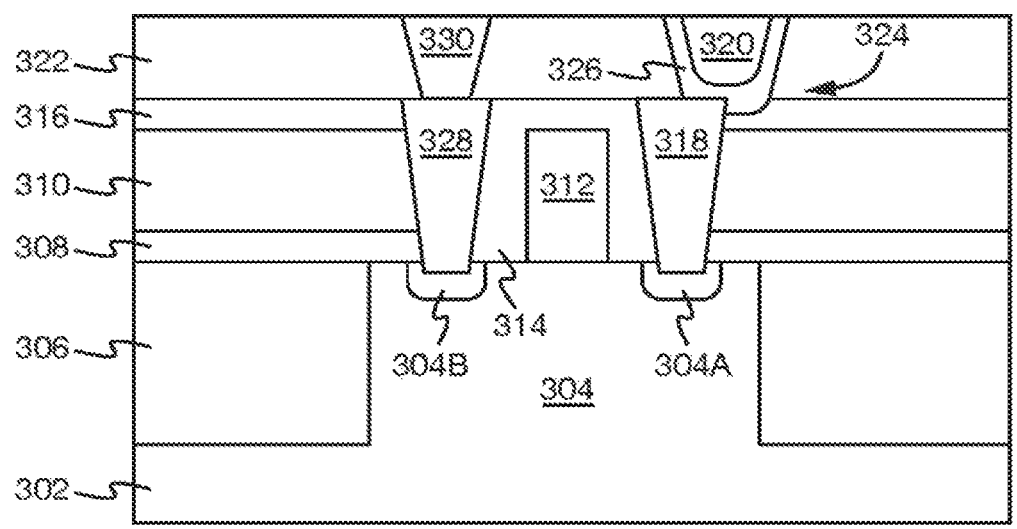
FIG. 10: a memory cell having a first via and a data storage layer with rounded edges according to some examples of the present disclosure in a cross-sectional side view.

FIG. 10 depicts a schematic illustration of a memory cell 1000 according to some examples of the present disclosure in a cross-sectional side view. The memory cell 1000 is also similar to the memory cell 300 of FIGS. 3a, 3b, but differs from the memory cell 300 in the design of the data storage element 324. In the example of FIG. 10, the first via 320 and the data storage layer 326 are disposed over the first MEOL structure 318. In some embodiments, the data storage layer 326 extends along a sidewall of the first MEOL structure 318. In some additional embodiments (not shown), the data storage layer 326 may further extend over a first upper surface of the MEOL structure 318 that is recessed that is below a top surface of the MEOL structure 318. The first via 320 and the data storage layer 326 have tapered sidewalls, e.g. similar to the data storage element 210 of FIG. 2b. In addition, edges of the bottom surface of the first via 320 and/or edges of the bottom surface of the data storage layer 326 are rounded or tapered, in particular edges extending perpendicular to the first direction as illustrated in FIG. 10. In some examples, without being bound by any theory, rounding the bottom edge of the first via 320 facing the first MEOL structure 318 may result in a weaker electric field in the vicinity of the edge and may thus hinder formation of a conducting filament between the edge of the first via 320 and the top surface of the first MEOL structure 318. In some examples, a radius of curvature of the bottom edges of the first via 320 may e.g. be between 1 nm and 100 nm, in one example between 5 nm and 20 nm.

Although the present disclosure is described in relation to a resistive random access memory (RRAM) device it will be appreciated that the present disclosure is not limited to RRAM devices. Rather, the present disclosure may also be applied to other types of memory devices also. For example, the present disclosure may be applied to ferroelectric random access memory (FeRAM), magneto random access memory (MRAM), phase change random access memory (PCRAM), and/or the like.

Some examples relate to a memory device. The memory device includes a bottom electrode disposed over a substrate, an upper surface of the bottom electrode facing away from the substrate; a top electrode over the bottom electrode, the top electrode having a bottom surface facing the substrate; a data storage layer arranged between the bottom electrode and the top electrode, at least a portion of the bottom surface of the top electrode not overlapping with any portion of the upper surface of the bottom electrode along a first direction parallel to the bottom surface of the top electrode; and at least a portion of the upper surface of the bottom electrode does not overlap with any portion of the bottom surface of the top electrode along the first direction. In some embodiments, no more than 60% of the surface area of the bottom surface of the top electrode overlap with a portion of the upper surface of the bottom electrode along the first direction. In some embodiments, the bottom surface of the top electrode does not overlap with the upper surface of the bottom electrode along the first direction. In some embodiments, the data storage layer surrounds the bottom surface and sidewalls of the top electrode. In some embodiments, the bottom surface of the data storage layer includes a protrusion extending along a sidewall of the bottom electrode. In some embodiments, the bottom surface of the top electrode includes a protrusion extending towards the bottom electrode. In some embodiments, the data storage layer includes a dielectric resistive memory layer. In some embodiments, the bottom electrode includes a tapered sidewall forming an acute angle with the upper surface of the bottom electrode at an edge of the bottom electrode facing the bottom surface of the top electrode; and the top electrode includes a tapered sidewall forming an obtuse angle with the bottom surface of the top electrode at an edge of the top electrode facing the upper surface of the bottom electrode.

Some examples relate to a memory device. The memory device includes a transistor having a first source/drain (S/D) region and a second S/D region; a first conductive structure in a first dielectric layer, the first conductive structure being electrically coupled to the first S/D region of the transistor; a second conductive structure in a second dielectric layer; and a data storage layer disposed between a top surface of the first conductive structure and a bottom surface of the second conductive structure; the top surface of the first conductive structure extending along a first direction from a first edge to a second edge; the bottom surface of the second conductive structure extending along the first direction from a third edge to a fourth edge; and the fourth edge shifted with respect to the second edge in the first direction, so that the bottom surface of the second conductive structure straddles the second edge. In some embodiments, the third edge is shifted with respect to the first edge in the first direction. In some embodiments, the memory device further includes a second MEOL structure in the first dielectric layer, the second MEOL structure being electrically coupled to second first S/D region of the transistor; and a first via in the second dielectric layer, a center of a bottom surface of the second MEOL structure being substantially aligned with a center of a top surface of the first via. In some embodiments, the first direction is parallel to a channel of the transistor extending from the second S/D region to the first S/D region; and the first via is shifted with respect to the second conductive structure in a second direction perpendicular to the first direction. In some embodiments, the memory device further includes a gate structure above the transistor between the first and second S/D regions; and a second via electrically coupled to the gate structure, the second via arranged between the second conductive structure and first via in the second direction.

Some examples relate to a method of manufacturing a memory device. The method includes forming a first conductive structure over a substrate; forming a data storage layer above an exposed portion of an upper surface of the first conductive structure, a center of the data storage layer being displaced from a center of the upper surface of the first conductive structure in a first direction parallel to the upper surface of the first conductive structure; and forming a second conductive structure above the data storage layer. In some embodiments, the method further includes forming a dielectric layer above the first conductive structure; and forming an opening in the dielectric layer that exposes the exposed portion of the upper surface of the first conductive structure, a center of the opening being displaced from the center of the upper surface of the first conductive structure in the first direction, and the data storage layer and the second conductive structure are formed in the opening. In some embodiments, the first conductive structure is arranged in an etch stop layer and the opening exposes an upper surface of the etch stop layer. In some embodiments, the opening extends below the upper surface of the first conductive structure into the etch stop layer. In some embodiments, the data storage layer is deposited conformally on a bottom wall and sidewalls of the opening. In some embodiments, a bottom surface of the second conductive structure has no overlap with an upper surface of the first conductive structure along the first direction. In some embodiments, a sidewall of the second conductive structure is displaced from a sidewall of the first conductive structure in the first direction.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated examples and/or un-illustrated examples. For example, "a first dielectric layer" described in connection with a first figure may not necessarily correspond to a "first dielectric layer" described in connection with another figure, and may not necessarily correspond to a "first dielectric layer" in an un-illustrated example.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A memory device, comprising:
 a bottom electrode disposed over a substrate, wherein an upper surface of the bottom electrode faces away from the substrate;
 a top electrode over the bottom electrode, wherein the top electrode has a bottom surface facing the substrate;
 a data storage layer arranged between the bottom electrode and the top electrode and along an outermost sidewall of the top electrode, wherein at least a portion of the bottom surface of the top electrode does not overlap with any portion of the upper surface of the bottom electrode along a first direction parallel to the bottom surface of the top electrode; and
 wherein at least a portion of the upper surface of the bottom electrode does not overlap with any portion of the bottom surface of the top electrode along the first direction.

2. The memory device of claim 1, wherein no more than 60% of a surface area of the bottom surface of the top electrode overlaps with the upper surface of the bottom electrode along the first direction.

3. The memory device of claim 2, wherein the bottom surface of the top electrode does not overlap with the upper surface of the bottom electrode along the first direction.

4. The memory device of claim 1, wherein the data storage layer surrounds the bottom surface and sidewalls of the top electrode.

5. The memory device of claim 1, wherein a bottom surface of the data storage layer comprises a protrusion extending along a sidewall of the bottom electrode.

6. The memory device of claim 1, wherein the bottom surface of the top electrode comprises a protrusion extending towards the bottom electrode.

7. The memory device of claim 1, wherein the data storage layer comprises a dielectric resistive memory layer.

8. The memory device of claim 1, wherein
 the bottom electrode comprises a tapered sidewall forming an acute angle with the upper surface of the bottom electrode at an edge of the bottom electrode facing the bottom surface of the top electrode; and
 the top electrode comprises a tapered sidewall forming an obtuse angle with the bottom surface of the top electrode at an edge of the top electrode facing the upper surface of the bottom electrode.

9. A memory device, comprising:
 a transistor comprising a first source/drain (S/D) region and a second S/D region;
 a first conductive structure in a first dielectric layer, the first conductive structure being electrically coupled to the first S/D region of the transistor;

a second conductive structure in a second dielectric layer; and a data storage layer disposed between a top surface of the first conductive structure and a bottom surface of the second conductive structure;

wherein:
- the top surface of the first conductive structure extends along a first direction from a first edge to a second edge;
- the bottom surface of the second conductive structure extends along the first direction from a third edge to a fourth edge; and
- the fourth edge is shifted with respect to the second edge in the first direction, so that the bottom surface of the second conductive structure straddles the second edge.

10. The memory device of claim 9, wherein the third edge is shifted with respect to the first edge in the first direction.

11. The memory device of claim 9, further comprising a second MEOL structure in the first dielectric layer, the second MEOL structure being electrically coupled to the second S/D region of the transistor; and
a first via in the second dielectric layer, wherein a center of a bottom surface of the second MEOL structure is substantially aligned with a center of a top surface of the first via.

12. The memory device of claim 11, wherein
the first direction is parallel to a channel of the transistor extending from the second S/D region to the first S/D region; and
the first via is shifted with respect to the second conductive structure in a second direction perpendicular to the first direction.

13. The memory device of claim 12, further comprising a gate structure above the transistor between the first and second S/D regions; and
a second via electrically coupled to the gate structure, wherein the second via is arranged between the second conductive structure and the first via in the second direction.

14. An integrated chip, comprising:
a lower conductor disposed over a substrate, wherein an upper surface of the lower conductor faces away from the substrate;
an upper conductor disposed over the lower conductor and having a substantially flat topmost surface that is laterally off-centered from the lower conductor, wherein the upper conductor has a bottom surface facing the substrate and wherein the substantially flat topmost surface extends between opposing outermost sidewalls of the upper conductor;
a data storage structure arranged between the lower conductor and the upper conductor, wherein the data storage structure comprises an upper surface that laterally straddles an outermost edge of the lower conductor; and
wherein a cumulative thickness of both the upper conductor and the data storage structure is larger measured along an outermost sidewall of the upper conductor than measured directly over the lower conductor.

15. The integrated chip of claim 14, wherein the data storage structure has a first thickness directly between the bottom surface of the upper conductor and the upper surface of the lower conductor and a second thickness laterally outside of the lower conductor, the first thickness being smaller than the second thickness.

16. The integrated chip of claim 14, wherein the bottom surface of the upper conductor is a substantially flat surface that continuously extends between the opposing outermost sidewalls of the upper conductor.

17. The integrated chip of claim 14, further comprising:
a dielectric layer surrounding the lower conductor, wherein the lower conductor extends from within the dielectric layer to a topmost surface of the dielectric layer.

18. The integrated chip of claim 14,
wherein the bottom surface of the upper conductor continuously extends between the opposing outermost sidewalls of the upper conductor and is completely above the upper surface of the lower conductor; and
wherein the bottom surface of the upper conductor laterally straddles the outermost edge of the lower conductor.

19. The integrated chip of claim 14, wherein the data storage structure is arranged along the upper surface and a sidewall of the lower conductor.

20. The integrated chip of claim 14, wherein the data storage structure has a larger height than the upper conductor.

* * * * *